United States Patent
Den Boef et al.

(10) Patent No.: US 10,698,322 B2
(45) Date of Patent: Jun. 30, 2020

(54) METROLOGY METHOD, COMPUTER PRODUCT AND SYSTEM

(71) Applicant: ASML NETHERLANDS B.V., Veldhoven (NL)

(72) Inventors: Arie Jeffrey Den Boef, Waalre (NL); Kaustuve Bhattacharyya, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/700,381

(22) Filed: Dec. 2, 2019

(65) Prior Publication Data

US 2020/0103762 A1 Apr. 2, 2020

Related U.S. Application Data

(63) Continuation of application No. 14/948,001, filed on Nov. 20, 2015, now Pat. No. 10,527,949.

(30) Foreign Application Priority Data

Nov. 26, 2014 (EP) .................................. 14195009

(51) Int. Cl.
*G03F 7/20* (2006.01)
*G01B 11/27* (2006.01)
*G01B 11/24* (2006.01)

(52) U.S. Cl.
CPC .......... *G03F 7/70616* (2013.01); *G01B 11/24* (2013.01); *G01B 11/27* (2013.01); *G03F 7/705* (2013.01); *G03F 7/70633* (2013.01)

(58) Field of Classification Search
CPC .. G03F 7/70616; G03F 7/705; G03F 7/70633; G01B 11/24; G01B 11/27
See application file for complete search history.

(56) References Cited

U.S. PATENT DOCUMENTS 7,587,704 B2 9/2009 Ye et al.
7,791,727 B2 9/2010 Den Boef et al.
(Continued)

FOREIGN PATENT DOCUMENTS

JP 2013051412 3/2013
JP 2013535819 9/2013
(Continued)

OTHER PUBLICATIONS

International Search Report dated Feb. 16, 2016 in corresponding International Patent Application No. PCT/EP2015/075308.
(Continued)

*Primary Examiner* — Seahvosh Nikmanesh
(74) *Attorney, Agent, or Firm* — Pillsbury Winthrop Shaw Pittman LLP

(57) ABSTRACT

A method including determining a type of structural asymmetry of the target from measured values of the target, and performing a simulation of optical measurement of the target to determine a value of an asymmetry parameter associated with the asymmetry type. A method including performing a simulation of optical measurement of a target to determine a value of an asymmetry parameter associated with a type of structural asymmetry of the target determined from measured values of the target, and analyzing a sensitivity of the asymmetry parameter to change in a target formation parameter associated with the target. A method including determining a structural asymmetry parameter of a target using a measured parameter of radiation diffracted by the target, and determining a property of a measurement beam of the target based on the structural asymmetry parameter that is least sensitive to change in a target formation parameter associated with the target.

35 Claims, 11 Drawing Sheets

(56) References Cited

U.S. PATENT DOCUMENTS

| | | |
|---|---|---|
| 8,411,287 B2 | 4/2013 | Smilde et al. |
| 8,797,554 B2 | 8/2014 | Straaijer |
| 8,867,020 B2 | 10/2014 | Smilde et al. |
| 8,908,147 B2 | 12/2014 | Den Boef et al. |
| 9,081,303 B2 | 7/2015 | Cramer et al. |
| 9,134,256 B2 | 9/2015 | Smilde et al. |
| 2006/0033921 A1 | 2/2006 | Den Boef et al. |
| 2009/0170042 A1 | 7/2009 | Kanda et al. |
| 2011/0027704 A1 | 2/2011 | Cramer et al. |
| 2011/0043791 A1 | 2/2011 | Smilde et al. |
| 2012/0013881 A1 | 1/2012 | Den Boef et al. |
| 2012/0242970 A1 | 9/2012 | Smilde et al. |
| 2013/0054186 A1 | 2/2013 | Den Boef |
| 2013/0258310 A1 | 10/2013 | Smilde et al. |
| 2013/0308142 A1 | 11/2013 | Straaijer |
| 2015/0346605 A1 | 12/2015 | Den Boef et al. |
| 2016/0161864 A1 | 6/2016 | Middlebrooks et al. |

FOREIGN PATENT DOCUMENTS

| | | |
|---|---|---|
| JP | 2015532733 | 11/2015 |
| KR | 20130024839 | 3/2013 |
| WO | 2009/078708 | 6/2009 |
| WO | 2009/106279 | 9/2009 |
| WO | 2010/069757 | 6/2010 |
| WO | 2011/012624 | 2/2011 |
| WO | 2012/010458 | 1/2012 |
| WO | 2013/087431 | 6/2013 |
| WO | 2013/143814 | 10/2013 |
| WO | 2014/005828 | 1/2014 |
| WO | 2014/068116 | 5/2014 |
| WO | 2015/018625 | 2/2015 |
| WO | 2015/078669 | 6/2015 |
| WO | 2015/185166 | 12/2015 |
| WO | 2016/086056 | 6/2016 |

OTHER PUBLICATIONS

Taiwan Office Action dated Feb. 9, 2018 in corresponding Taiwan Patent Application No. 106103409.

Japanese Office Action issued in corresponding Japanese Patent Application No. 2017-528445; dated Jul. 3, 2018.

Korean Office Action issued in corresponding Korean Patent Application No. 10-2017-7016700, dated Nov. 8. 2018.

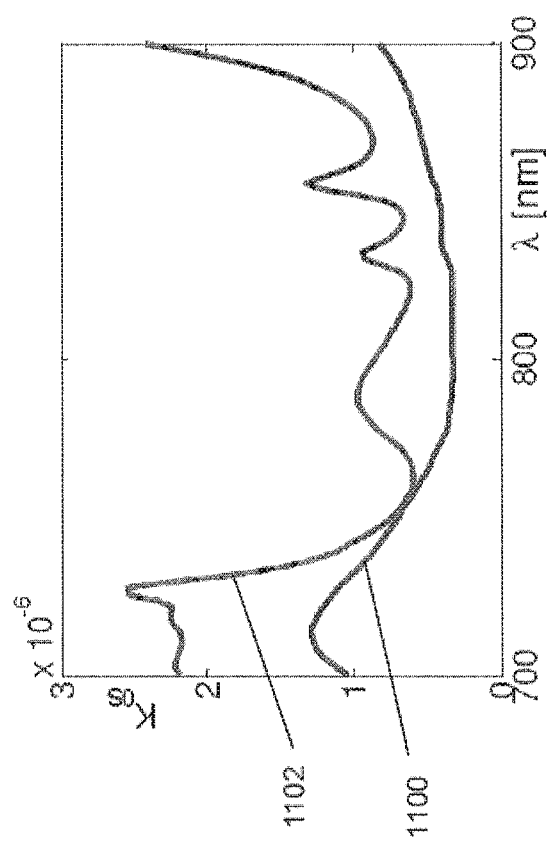
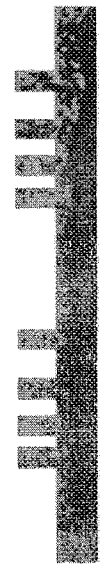
Fig 10(A)
Fig. 10(B)
Fig. 10(C)

METROLOGY METHOD, COMPUTER PRODUCT AND SYSTEM

This application is a continuation of U.S. patent application Ser. No. 14/948,001, filed on Nov. 20, 2015, which claims priority of European patent application no. EP14195009.7, filed on Nov. 26, 2014, each of the foregoing applications is incorporated herein in its entirety by reference.

FIELD

The present description relates to a method, apparatus, and computer product for metrology usable, for example, in the manufacture of devices by a lithographic technique and to a method of manufacturing devices using a lithographic technique.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In a lithographic process (i.e., a process of developing a device or other structure involving lithographic exposure, which may typically include one or more associated processing steps such as development of resist, etching, etc.), it is desirable frequently to make measurements of structures created, e.g., for process control and verification. Various tools for making such measurements are known, including scanning electron microscopes, which are often used to measure critical dimension (CD), and specialized tools to measure overlay, the accuracy of alignment of two layers of a substrate. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods; library searches; and principal component analysis.

SUMMARY

Device manufacturers align substrates using targets (marks) that are present on a substrate. An alignment sensor measures the location of the mark with sub-nm repeatability. The manufacturers also measure, for example, on-product overlay using overlapping periodic structures of a target. Here sub-nm Total Measurement Uncertainty (TMU) numbers may be achieved as well. However, the transverse profile of a periodic structure of the target may have an asymmetry or a shape that affects the measured property. Metrology apparatuses and alignment sensors are sensitive to target structural asymmetry caused by, for example, processing steps like etching, chemical mechanical polishing (CMP), deposition, etc. Such asymmetry leads to measurement errors that are of the order of a few nm's. This effect may start to dominate the position and/or overlay budget and solutions are therefore needed.

Measurement recipe selection (for example with each recipe having one or more various wavelengths and/or one or more polarizations of illumination) may be performed using parameters such as mean Tool Induced Shift (TIS) and/or TIS variability (a.k.a. TIS 3 sigma). But, there is a problem when the reference layer exhibits an asymmetrical profile.

Asymmetry in the shape of a periodic structure of a target will generally have an impact on the measured overlay, alignment, etc. This impact can vary depending on the illumination setting used for the measurement.

Target recipe selection is performed without actual knowledge of the shape of the periodic structure of the target after processing and imaging. Furthermore, the context of the current process is not used in the decision of recipe selection. Use of a qualifier that is based on TIS and/or TMU does not always lead to a measurement recipe that is most robust against target asymmetry.

It is desirable to provide a method and apparatus for metrology using a target, in which throughput, flexibility and/or accuracy can be improved. Furthermore, although the invention is not limited to this, it would be of great advantage, if this could be applied to small target structures that can be read out with a dark-field technique.

In an embodiment, there is provided a method comprising determining a type of a structural asymmetry of the target from measured values of the target, and performing a simulation of optical measurement of the target to determine a value of an asymmetry parameter associated with the asymmetry type.

Thus, a type (e.g., side wall angle asymmetry, spacer unbalance, etc.) of structural asymmetry of a target is determined from measured values of the target (e.g., optical measurements). A simulation of optical measurement of the target is performed. The simulation is used to determine a value of an asymmetry parameter associated with the asymmetry type. Such an asymmetry parameter may be a positional offset (e.g., $X_{os}$ as described herein), due the asymmetry, of a measurement using the target and/or a scale factor (G as described herein) relating a positional offset, due the asymmetry, of a measurement using the target to a process-dependent scale factor offset, due to the asymmetry, of measurement using the target. The determined asymmetry parameter may be used to, for example, correct the calculation of overlay associated with overlay measurement results of the target.

In an embodiment, there is provided a method comprising performing a simulation of optical measurement of a target to determine a value of an asymmetry parameter associated with a type of a structural asymmetry of the target determined from measured values of the target, and analyzing a sensitivity of the asymmetry parameter to change in a target formation parameter associated with the target.

Thus, a simulation of optical measurement of a target is performed. The simulation is used to determine a value of an asymmetry parameter (e.g., $X_{os}$ and/or G) associated with a structural asymmetry type (e.g., side wall angle asymmetry, spacer unbalance, etc.) determined from measured values of the target (e.g., optical measurements). Further, a sensitivity of the asymmetry parameter to change in a target formation parameter (e.g., variation in stack refractive index, variation in stack thickness, etc.) associated with the target is analyzed. In an embodiment, the sensitivity may be analyzed for one or more optical measurement settings (e.g., wavelength, polarization, etc.) to find the optical measurement setting having a low or minimal value of the sensitivity. The optical measurement setting may be used to make overlay measurements of the target. Further, the asymmetry parameter may be used to, for example, correct the calculation of overlay from overlay measurements.

In an embodiment, there is provided a method comprising determining a structural asymmetry parameter of a target using a measured parameter of radiation diffracted by the target, and determining a property of a measurement beam of the target based on the structural asymmetry parameter that is least sensitive to change in a target formation parameter associated with the target.

A value of a structural asymmetry parameter (e.g., $X_{os}$ and/or G) may be determined from a measured parameter of radiation diffracted by the target. The value of the structural asymmetry parameter may be determined by, e.g., determining an asymmetry type using the measured parameter and performing a simulation of optical measurement of the target to calculate the structural asymmetry parameter for the asymmetry type. Further, a property of a measurement beam (e.g., wavelength, polarization, etc.) of the target is determined based on the structural asymmetry parameter that is least sensitive to change in a target formation parameter (e.g., variation in stack refractive index, variation in stack thickness, etc.) associated with the target. The determined measurement beam property may be used to make overlay measurements of the target. Further, the structural asymmetry parameter may be used to, for example, correct the calculation of overlay from overlay measurements.

In an embodiment, there is provided a method of manufacturing devices wherein a device pattern is applied to a series of substrates using a lithographic process, the method including evaluating at least one diffraction measurement target using a method as described herein and controlling the lithographic process for one or more of the substrates in accordance with the result of the method. In an embodiment, the at least one diffraction measurement target is formed as part of or beside the device pattern on at least one of the substrates and controlling the lithographic process comprises controlling the lithographic process for later substrates in accordance with the result of the method.

In an embodiment, there is provided a non-transitory computer program product comprising machine-readable instructions for causing a processor to cause performance of a method as described herein In an embodiment, there is provided a system comprising: an inspection apparatus configured to provide a beam on a diffraction measurement target on a substrate and to detect radiation diffracted by the target to determine a parameter of a lithographic process; and a non-transitory computer program product as described herein.

Features and/or advantages of embodiments of the invention, as well as the structure and operation of various embodiments of the invention, are described in detail herein with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which:

FIG. 10(A) is a graph depicting example $K_{os}$ values as a function of wavelength for two different types of structural asymmetry—sidewall angle structural asymmetry and spacer unbalance structural asymmetry;

FIG. 10(B) is a schematic representation of sidewall angle structural asymmetry;

FIG. 10(C) is a schematic representation of spacer unbalance structural asymmetry;

DETAILED DESCRIPTION

Before describing embodiments in detail, it is instructive to present an example environment in which embodiments may be implemented.

Figures 1, 2:
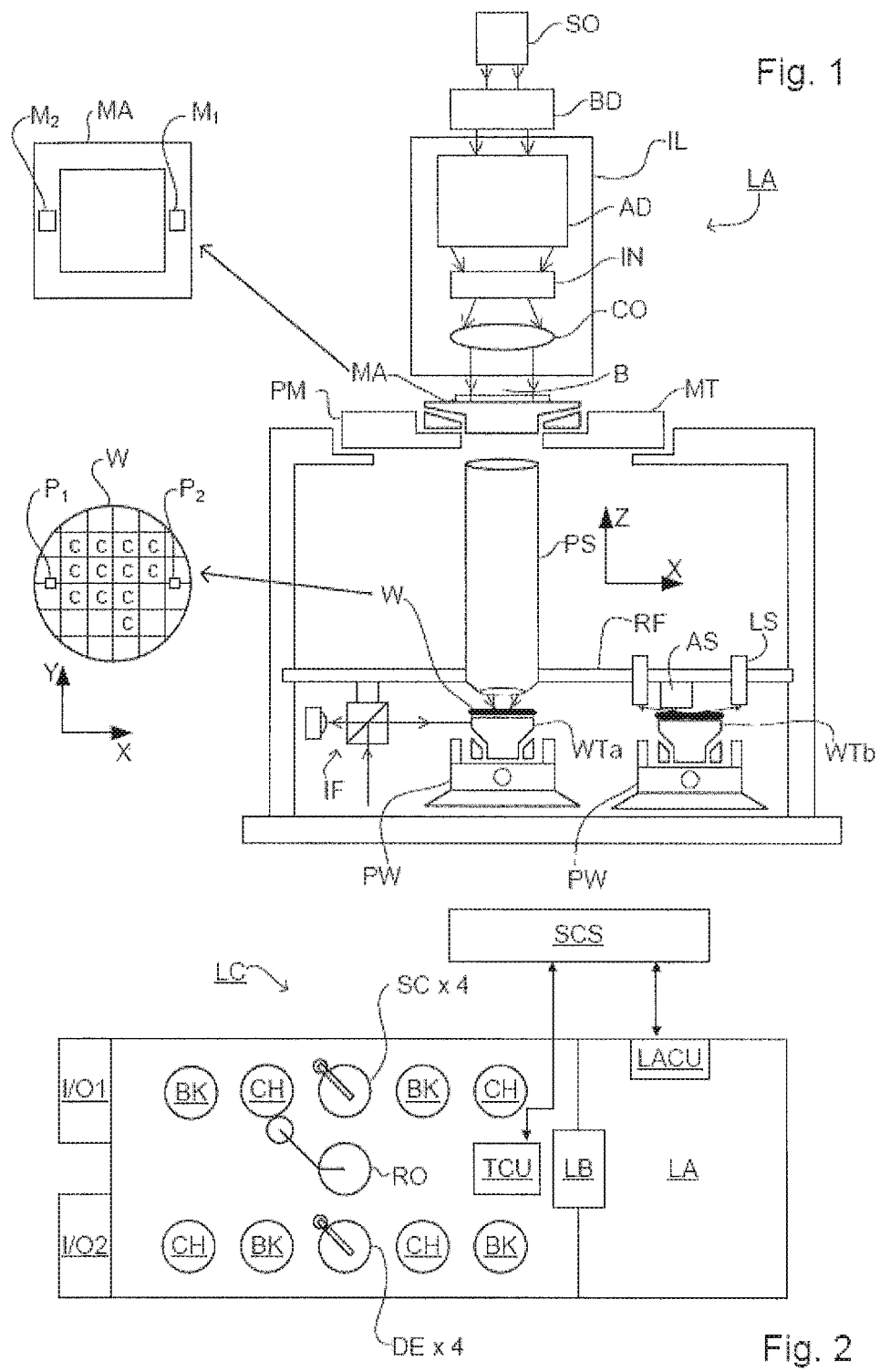
FIG. 1 depicts a lithographic apparatus according to an embodiment of the invention.
FIG. 2 depicts a lithographic cell or cluster according to an embodiment of the invention.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks $P_1$, $P_2$. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. An embodiment of an alignment system, which can detect the alignment markers, is described further below.

The depicted apparatus could be used in at least one of the following modes:

1. In step mode, the patterning device support (e.g., mask table) MT and the substrate table WTa are kept essentially stationary, while an entire pattern imparted to the radiation beam is projected onto a target portion C at one time (i.e., a single static exposure). The substrate table WTa is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT and the substrate table WTa are scanned synchronously while a pattern imparted to the radiation beam is projected onto a target portion C (i.e., a single dynamic exposure). The velocity and direction of the substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two tables WTa, WTb (e.g., two substrate tables) and two stations—an exposure station and a measurement station—between which the tables can be exchanged. For example, while a substrate on one table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS, both sensors being supported by a reference frame RF. If the position sensor IF is not capable of measuring the position of a table while it is at the measurement station as well as at the exposure station, a second position sensor may be provided to enable the positions of the table to be tracked at both stations. As another example, while a substrate on one table is being exposed at the exposure station, another table without a substrate waits at the measurement station (where optionally measurement activity may occur). This other table has one or more measurement devices and may optionally have other tools (e.g., cleaning apparatus). When the substrate has completed exposure, the table without a substrate moves to the exposure station to perform, e.g., measurements and the table with the substrate moves to a location (e.g., the measurement station) where the substrate is unloaded and another substrate is load. These multi-table arrangements enable a substantial increase in the throughput of the apparatus.

As shown in FIG. 2, the lithographic apparatus LA forms part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

In order that the substrate that is exposed by the lithographic apparatus is exposed correctly and consistently, it is desirable to inspect an exposed substrate to measure one or more properties such as overlay error between subsequent layers, line thickness, critical dimension (CD), etc. If an error is detected, an adjustment may be made to an exposure of one or more subsequent substrates, especially if the inspection can be done soon and fast enough that another substrate of the same batch is still to be exposed. Also, an already exposed substrate may be stripped and reworked (to improve yield) or discarded, thereby avoiding performing an exposure on a substrate that is known to be faulty. In a case where only some target portions of a substrate are faulty, a further exposure may be performed only on those target portions which are good. Another possibility is to adapt a setting of a subsequent process step to compensate for the error, e.g. the time of a trim etch step can be adjusted to compensate for substrate-to-substrate CD variation resulting from the lithographic process step.

An inspection apparatus is used to determine one or more properties of a substrate, and in particular, how one or more properties of different substrates or different layers of the same substrate vary from layer to layer and/or across a substrate. The inspection apparatus may be integrated into the lithographic apparatus LA or the lithocell LC or may be a stand-alone device. To enable most rapid measurements, it is desirable that the inspection apparatus measure one or more properties in the exposed resist layer immediately after the exposure. However, the latent image in the resist has a very low contrast—there is only a very small difference in refractive index between the part of the resist which has been exposed to radiation and that which has not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibility for rework of a faulty substrate but may still provide useful information, e.g. for the purpose of process control.

A target used by a conventional scatterometer comprises a relatively large periodic structure layout (e.g., comprising one or more gratings), e.g., 40 µm by 40 µm. In that case, the measurement beam often has a spot size that is smaller than the periodic structure layout (i.e., the layout is underfilled such that one or more of the periodic structures is not completely covered by the spot). This simplifies mathematical reconstruction of the target as it can be regarded as infinite. However, for example, so the target can be positioned in among product features, rather than in the scribe lane, the size of a target has been reduced, e.g., to 20 µm by 20 µm or less, or to 10 µm by 10 µm or less. In this situation, the periodic structure layout may be made smaller than the measurement spot (i.e., the periodic structure layout is overfilled). Typically such a target is measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay using dark-field detection of the diffraction orders enables overlay measurements on smaller targets. These targets can be smaller than the illumination spot and may be surrounded by product structures on a substrate. In an embodiment, multiple targets can be measured in one image.

In an embodiment, the target on a substrate may comprise one or more 1-D periodic gratings, which are printed such that after development, the bars are formed of solid resist lines. In an embodiment, the target may comprise one or more 2-D periodic gratings, which are printed such that after development, the one or more gratings are formed of solid resist pillars or vias in the resist. The bars, pillars or vias may alternatively be etched into the substrate. The pattern of the grating is sensitive to chromatic aberrations in the lithographic projection apparatus, particularly the projection system PL, and illumination symmetry and the presence of such aberrations will manifest themselves in a variation in the printed grating. Accordingly, the measured data of the printed gratings can be used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other measurement processes.

Figure 3A:
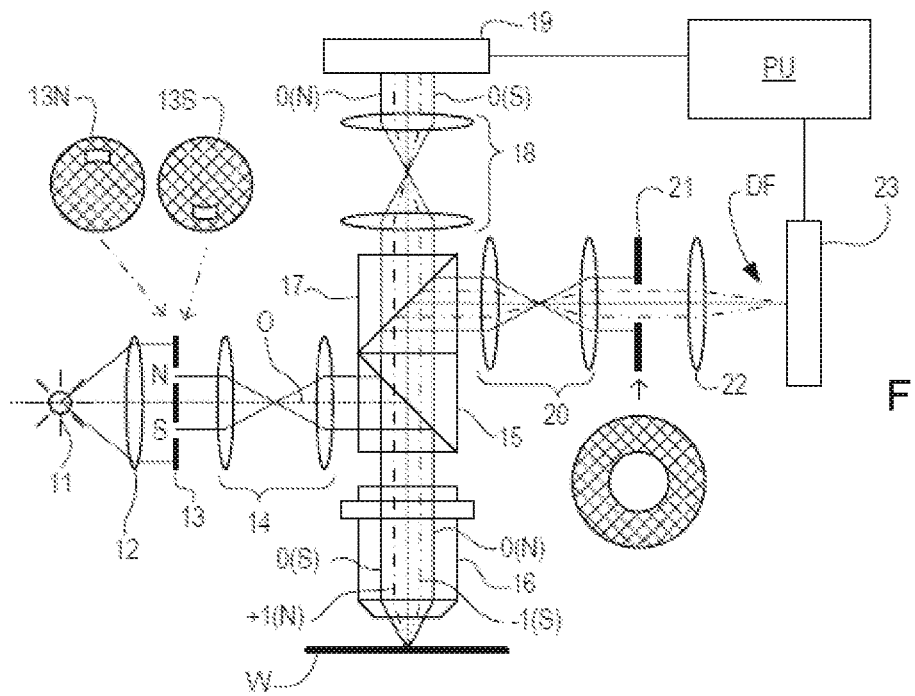
FIG. 3A is schematic diagram of a dark field measurement apparatus for use in measuring targets according to embodiments of the invention using a first pair of illumination apertures providing certain illumination modes.

A dark field metrology apparatus suitable for use in embodiments of the invention is shown in FIG. 3A. A target T (comprising a periodic structure such as a grating) and diffracted rays are illustrated in more detail in FIG. 3B. The dark field metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, radiation emitted by an output 11 (e.g., a source such as a laser or a xenon lamp or an opening connected to a source) is directed onto substrate W via a prism 15 by an optical system comprising lenses 12, 14 and objective lens 16. These lenses are arranged in a double sequence of a 4F arrangement. A different lens arrangement can be used, provided that it still provides a substrate image onto a detector.

In an embodiment, the lens arrangement allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done, for example, by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis illumination from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary radiation outside the desired illumination mode may interfere with the desired measurement signals.

Figures 3B, 3C, 3D:
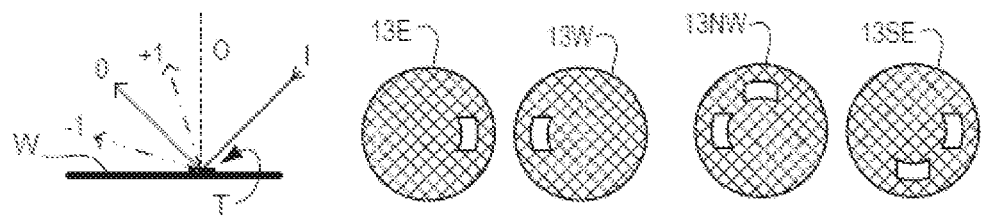
FIG. 3B is a schematic detail of a diffraction spectrum of a target for a given direction of illumination.
FIG. 3C is a schematic illustration of a second pair of illumination apertures providing further illumination modes in using a measurement apparatus for diffraction based overlay measurements.
FIG. 3D is a schematic illustration of a third pair of illumination apertures combining the first and second pairs of apertures providing further illumination modes in using a measurement apparatus for diffraction based overlay measurements.

As shown in FIG. 3B, target T is placed with substrate W substantially normal to the optical axis O of objective lens 16. A ray of illumination I impinging on target T from an angle off the axis O gives rise to a zeroth order ray (solid line O) and two first order rays (dot-chain line +1 and double dot-chain line −1). With an overfilled small target T, these rays are just one of many parallel rays covering the area of the substrate including metrology target T and other features. Since the aperture in plate 13 has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the periodic structure pitch and illumination angle can be designed or adjusted so that the first order rays entering the objective lens are closely aligned with the central optical axis. The rays illustrated in FIGS. 3A and 3B are shown somewhat off axis, purely to enable them to be more easily distinguished in the diagram.

At least the 0 and +1 orders diffracted by the target on substrate W are collected by objective lens 16 and directed back through prism 15. Returning to FIG. 3A, both the first and second illumination modes are illustrated, by designating diametrically opposite apertures labeled as north (N) and south (S). When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16. Thus, in an embodiment, measurement results are obtained by measuring the target twice under certain conditions, e.g., after rotating the target or changing the illumination mode or changing the imaging mode to obtain separately the $-1^{st}$ and the $+1^{st}$ diffraction order intensities. Comparing these intensities for a given target provides a measurement of asymmetry in the target, and asymmetry in the target can be used as an indicator of a parameter of a lithography process, e.g., overlay error. In the situation described above, the illumination mode is changed.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction, which are not described in detail here.

In the second measurement branch, optical system 20, 22 forms an image of the target on the substrate W on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image DF of the target formed on sensor 23 is formed from the −1 or +1 first order beam. The images captured by sensors 19 and 23 are output to image processor and controller PU, the function of which will depend on the particular type of measurements being performed. Note that the term 'image' is used here in a broad sense. An image of the periodic structure features (e.g., grating lines) as such will not be formed, if only one of the −1 and +1 orders is present.

The particular forms of aperture plate 13 and stop 21 shown in FIG. 3 are purely examples. In another embodiment of the invention, on-axis illumination of the targets is used and an aperture stop with an off-axis aperture is used to pass substantially only one first order of diffracted radiation to the sensor. In yet other embodiments, 2nd, 3rd and higher order beams (not shown in FIG. 3) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Note that aperture plate 13N or 13S are used to measure a periodic structure of a target oriented in one direction (X or Y depending on the set-up). For measurement of an orthogonal periodic structure, rotation of the target through 90° and 270° might be implemented. Different aperture plates are shown in FIGS. 3C and 3D. FIG. 3C illustrates two further types of off-axis illumination mode. In a first illumination mode of FIG. 3C, aperture plate 13E provides off-axis illumination from a direction designated, for the sake of description only, as 'east' relative to the 'north' previously described. In a second illumination mode of FIG. 3C, aperture plate 13W is used to provide similar illumination, but from an opposite direction, labeled 'west'. FIG. 3D illustrates two further types of off-axis illumination mode. In a first illumination mode of FIG. 3D, aperture plate 13NW provides off-axis illumination from the directions designated 'north' and 'west' as previously described. In a second illumination mode, aperture plate 13SE is used to provide similar illumination, but from an opposite direction, labeled 'south' and 'east' as previously described. The use of these, and numerous other variations and applications of the apparatus are described in, for example, the prior published patent application publications mentioned above.

Figure 4:
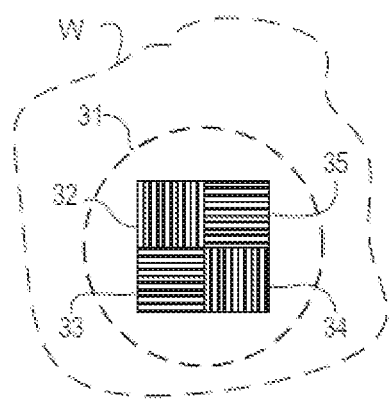
FIG. 4 depicts a form of multiple periodic structure (e.g., multiple grating) target and an outline of a measurement spot on a substrate.

FIG. 4 depicts an example composite metrology target formed on a substrate. The composite target comprises four periodic structures (in this case, gratings) 32, 33, 34, 35 positioned closely together. In an embodiment, the periodic structures are positioned closely together enough so that they all are within a measurement spot 31 formed by the illumination beam of the metrology apparatus. In that case, the four periodic structures thus are all simultaneously illuminated and simultaneously imaged on sensors 19 and 23. In an example dedicated to overlay measurement, periodic structures 32, 33, 34, 35 are themselves composite periodic structures (e.g., composite gratings) formed by overlying periodic structures, i.e., periodic structures are patterned in different layers of the device formed on substrate W and such that at least one periodic structure in one layer overlays at least one periodic structure in a different layer. Such a target may have outer dimensions within 20 μm×20 μm or within 16 μm×16 μm. Further, all the periodic structures are used to measure overlay between a particular pair of layers. To facilitate a target being able to measure more than a single pair of layers, periodic structures 32, 33, 34, 35 may have differently biased overlay offsets in order to facilitate measurement of overlay between different layers in which the different parts of the composite periodic structures are formed. Thus, all the periodic structures for the target on the substrate would be used to measure one pair of layers and all the periodic structures for another same target on the substrate would be used to measure another pair of layers, wherein the different bias facilitates distinguishing between the layer pairs. The meaning of overlay bias will be explained below, particularly with reference to FIG. 7.

Figure 7A:
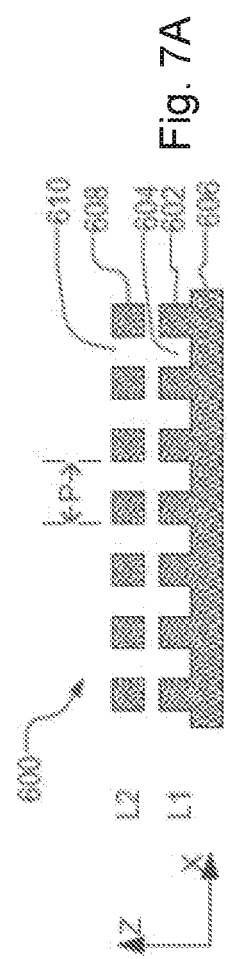
FIG. 7A, FIG. 7B, FIG. 7C and FIG. 7D show schematic cross-sections of overlay periodic structures (e.g., gratings) having different overlay values in the region of zero.
Figure 7B:
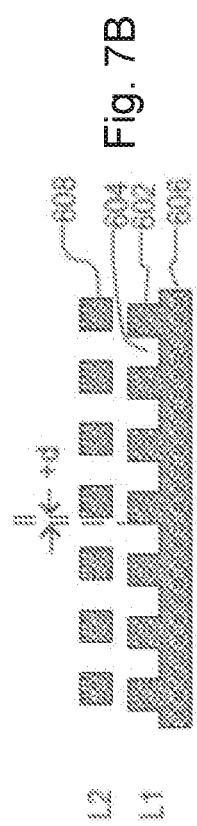
Figure 7C:
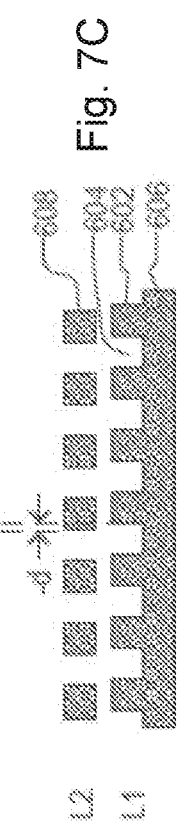

FIGS. 7A to 7C show schematic cross sections of overlay periodic structures (in this case gratings) of respective targets T, with different biases. These can be used on substrate W, as seen in FIGS. 3 and 4. Periodic structures with periodicity in the X direction are shown for the sake of example only. Different combinations of these periodic structures with different biases and with different orientations can be provided.

Starting with FIG. 7A, a composite overlay target 600 formed in two layers, labeled L1 and L2, is depicted. In the bottom layer L1, a first periodic structure (in this case a grating) is formed by features (e.g., lines) 602 and spaces 604 on a substrate 606. In layer L2, a second periodic structure (in this case a grating) is formed by features (e.g., lines) 608 and spaces 610. (The cross-section is drawn such that the features 602, 608 extend into the page.) The periodic structure pattern repeats with a pitch P in both layers. Lines 602 and 608 are mentioned for the sake of example only, other types of features such as dots, blocks and via holes can be used. In the situation shown at FIG. 7A, there is no overlay error and no bias, so that each feature 608 lies exactly over a feature 602 in the bottom periodic structure (where the measurement is "line-on-line"—in an embodiment, no overlay error may occur where each feature 608 lies exactly over a space 610 wherein the measurement is "line-on-trench").

At FIG. 7B, the same target with a bias +d is depicted such that the features 608 of the upper periodic structure are shifted by a distance d to the right (the distance d being less than the pitch P), relative to the features 602 of the lower periodic structures. That is, features 608 and features 602 are arranged so that if they were both printed exactly at their nominal locations, features 608 would be offset relative to the features 602 by the distance d. The bias distance d might be a few nanometers in practice, for example 10 nm 20 nm, while the pitch P is for example in the range 300-1000 nm, for example 500 nm or 600 nm. At FIG. 7C, the same target with a bias −d is depicted such that the features 608 are shifted to the left relative to the features 602. Biased targets of this type shown at FIGS. 7A to 7C, and their use in measurement, are described in, for example, the patent application publications mentioned above.

Further, as alluded to above, while FIGS. 7A to 7C depicts the features 608 lying over the features 602 (with or without a small bias of +d or −d applied), which is referred to as a "line on line" target having a bias in the region of zero, a target may have a programmed bias of P/2, that is half the pitch, such that each feature 608 in the upper periodic structure lies over a space 604 in the lower periodic structure. This is referred to as a "line on trench" target. In this case, a small bias of +d or −d may also be applied. The choice between "line on line" target or a "line on trench" target depends on the application.

Returning to FIG. 4, periodic structures 32, 33, 34, 35 may also differ in their orientation, as shown, so as to diffract incoming radiation in X and Y directions. In one example, periodic structures 32 and 34 are X-direction periodic structures with biases of +d, −d, respectively. Periodic structures 33 and 35 may be Y-direction periodic structures with offsets +d and −d respectively. While four periodic structures are illustrated, another embodiment may include a larger matrix to obtain desired accuracy. For example, a 3×3 array of nine composite periodic structures may have biases −4d, −3d, −2d, −d, 0, +d, +2d, +3d, +4d. Separate images of these periodic structures can be identified in the image captured by sensor 23.

Figure 5:
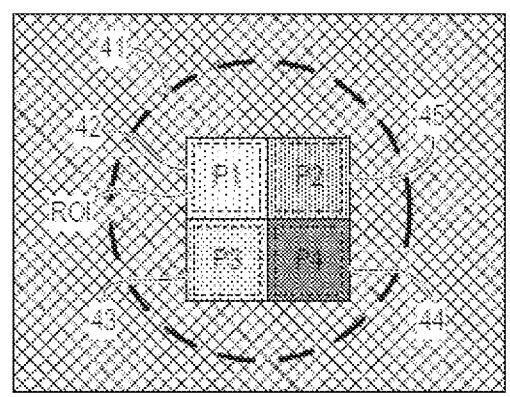
FIG. 5 depicts an image of the target of FIG. 4 obtained in the apparatus of FIG. 3.

FIG. 5 shows an example of an image that may be formed on and detected by the sensor 23, using the target of FIG. 4 in the apparatus of FIG. 3, using the aperture plates 13NW or 13SE from FIG. 3D. While the sensor 19 cannot resolve the different individual periodic structures 32 to 35, the sensor 23 can do so. The dark rectangle represents the field of the image on the sensor, within which the illuminated spot 31 on the substrate is imaged into a corresponding circular area 41. Within this, rectangular areas 42-45 represent the images of the periodic structures 32 to 35. If the periodic structures are located in product areas, product features may also be visible in the periphery of this image field. Image processor and controller PU processes these images using pattern recognition to identify the separate images 42 to 45 of periodic structures 32 to 35. In this way, the images do not have to be aligned very precisely at a specific location within the sensor frame, which greatly improves throughput of the measuring apparatus as a whole.

Once the separate images of the periodic structures have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an example of such a parameter.

Figure 6:
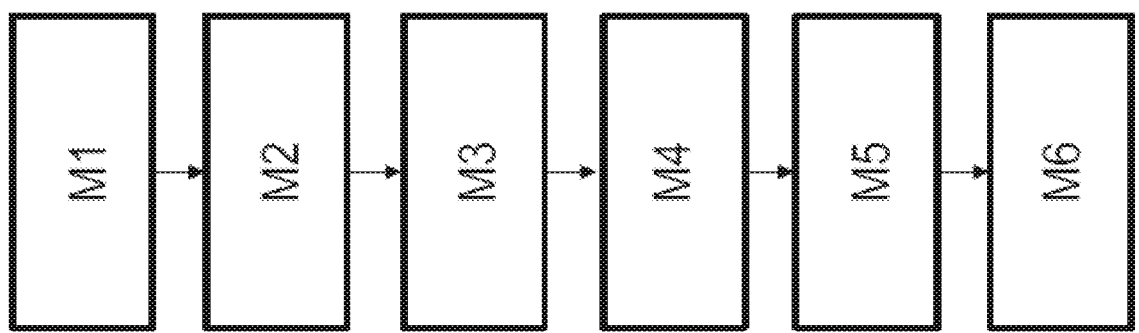
FIG. 6 is a flowchart showing the steps of an overlay measurement method using the apparatus of FIG. 3 and adaptable to embodiments of the present invention.

FIG. 6 illustrates how, using for example the method described in PCT patent application publication no. WO 2011/012624, overlay error between the two layers containing the component periodic structures 32 to 35 is measured through asymmetry of the periodic structures, as revealed by comparing their intensities in the +1 order and −1 order dark field images. At step M1, the substrate, for example a semiconductor wafer, is processed through the lithographic cell of FIG. 2 one or more times, to create a structure including the target comprising periodic structures 32-35. At M2, using the metrology apparatus of FIG. 3, an image of the periodic structures 32 to 35 is obtained using one of the first order diffracted beams (say −1). In an embodiment, a first illumination mode (e.g., the illumination mode created using aperture plate 13NW) is used. Then, whether by, for example, changing the illumination mode, or changing the imaging mode, or by rotating substrate W by 180° in the field of view of the metrology apparatus, a second image of the periodic structures using the other first order diffracted beam (+1) can be obtained (step M3). Consequently, the +1 diffracted radiation is captured in the second image. In an embodiment, the illuminated mode is changed and a second illumination mode (e.g., the illumination mode created using aperture plate 13SE) is used. In an embodiment, tool-induced artifacts like TIS (Tool Induced Shift) can be removed by doing the measurement at 0° and 180° substrate orientation.

Note that, by including only half of the first order diffracted radiation in each image, the 'images' referred to here are not conventional dark field microscopy images. The individual periodic structure features are not resolved. Each periodic structure will be represented simply by an area of a certain intensity level. In step M4, a region of interest (ROI) is identified within the image of each component periodic structure, from which intensity levels will be measured.

Having identified the region of interest P1, P2, P3, P4 for each respective individual periodic structure 32-35 and measured its intensity, the asymmetry of the periodic structure, and hence, e.g., overlay error, can then be determined. This is done by the image processor and controller PU in step M5 comparing the intensity values obtained for +1 and −1 orders for each periodic structure 32-35 to identify any difference in their intensity, i.e., an asymmetry. The term "difference" is not intended to refer only to subtraction. Differences may be calculated in ratio form. In step M6 the measured asymmetries for a number of periodic structures are used together with, if applicable, knowledge of the overlay biases of those periodic structures to calculate one or more performance parameters of the lithographic process in the vicinity of the target T. A performance parameter of interest is overlay. Other parameters of performance of the lithographic process can be calculated such as focus and/or dose. The one or more performance parameters can be fed back for improvement of the lithographic process, used to improve the measurement and calculation process of FIG. 6 itself, used to improve the design of the target T, etc.

Figure 8:
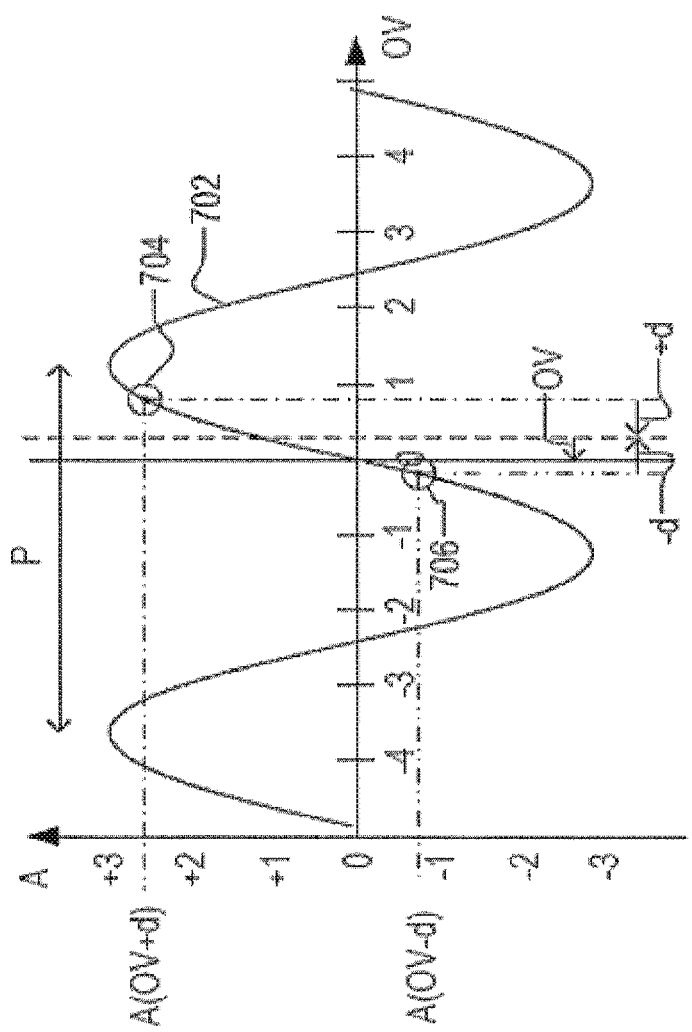
FIG. 8 illustrates principles of overlay measurement in an ideal target structure.

In an embodiment to determine overlay, FIG. 8 depicts a curve 702 that illustrates the relationship between overlay error OV and measured asymmetry A for an 'ideal' target having zero offset and no structural asymmetry within the individual periodic structures forming the overlay target. These graphs are to illustrate the principles of determining the overlay only, and in each graph, the units of measured asymmetry A and overlay error OV are arbitrary.

In the 'ideal' situation of FIGS. 7A to 7C, the curve 702 indicates that the measured asymmetry A has a sinusoidal relationship with the overlay. The period P of the sinusoidal variation corresponds to the period (pitch) of the periodic structures, converted of course to an appropriate scale. The sinusoidal form is pure in this example, but can include harmonics in real circumstances. For the sake of simplicity, it is assumed in this example (a) that only first order diffracted radiation from the target reaches the image sensor 23 (or its equivalent in a given embodiment), and (b) that the experimental target design is such that within these first orders a pure sine-relation exists between intensity and overlay between upper and lower periodic structures results. Whether this is true in practice is a function of the optical system design, the wavelength of the illuminating radiation and the pitch P of the periodic structure, and the design and stack of the target.

As mentioned above, biased periodic structures can be used to measure overlay, rather than relying on a single measurement. This bias has a known value defined in the patterning device (e.g. a reticle) from which it was made, that serves as an on-substrate calibration of the overlay corresponding to the measured signal. In the drawing, the calculation is illustrated graphically. In steps M1-M5 of FIG. 6, asymmetry measurements A(+d) and A(−d) are obtained for component periodic structures having biases +d an −d respectively (as shown in FIGS. 7B and 7C, for example). Fitting these measurements to the sinusoidal curve gives points 704 and 706 as shown. Knowing the biases, the true overlay error OV can be calculated. The pitch P of the sinusoidal curve is known from the design of the target. The vertical scale of the curve 702 is not known to start with, but is an unknown factor which we can call a 1st harmonic proportionality constant, K.

In equation terms, the relationship between overlay and measured asymmetry A is assumed to be:

$$A = K \sin(OV) \tag{1}$$

where OV is expressed on a scale such that the periodic structure pitch P corresponds to an angle 2π radians. Using two measurements with periodic structures with different, known biases to arrive at two values of A, one can solve two equations to calculate the unknowns K and overlay OV.

Although these measurement techniques are fast and relatively computationally simple (once calibrated), they rely on an assumption that the overlay/lateral shift is the only cause of asymmetry. That is, it assumes an 'ideal' situation with, for example, no structural asymmetry in the target. Any structural asymmetry in the stack, such as asymmetry of features within one or both of the overlaid periodic structures, also causes an asymmetry in the $1^{st}$ orders besides the overlay/lateral shift. This structural asymmetry which is not related to the overlay clearly perturbs the measurement, giving an inaccurate result.

As an example of structural asymmetry, one or more of the periodic structures of the target may be structurally deformed. For example, one or more side walls of periodic structure features (e.g., grating lines) of the target may not be vertical as intended. As another example, one or spaces between periodic structure features (e.g., grating spaces of trenches) of a target may be larger or smaller than as intended. Further, one or more features of a periodic structure of a target (e.g., grating lines) may have a smaller or larger width than as intended. Additionally, even where a difference from intended is uniform for one or more periodic structures of the target, that difference from intended may not be the same as for one or more other periodic structures of the target. Structural asymmetry in the lower periodic structure of a composite target is a common form of structural asymmetry. It may originate, for example, in the substrate processing steps such as chemical-mechanical polishing (CMP), performed after the lower periodic structure was originally formed.

Figure 7D:
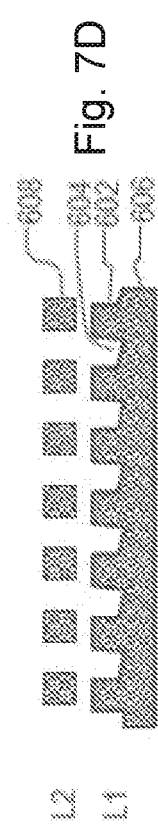

Referring to FIG. 7D, an example of structural asymmetry of a lower periodic structure is schematically depicted. The features and spaces in the periodic structures at FIG. 7A to 7C are shown as perfectly square-sided, when a real feature and space would have some slope on a surface, and a certain roughness. Nevertheless they are intended to be at least symmetrical in profile. The features 602 and/or spaces 604 at FIG. 7D in the lower periodic structure no longer have a symmetrical form at all, but rather have become distorted by, for example, one or more processing steps. Thus, for example, a bottom surface of each space 604 has become tilted. Side wall angles of the features and spaces have become asymmetrical also. When overlay is measured by the method of FIG. 6 using only two biased periodic structures, the structural asymmetry cannot be distinguished from overlay, and overlay measurements become unreliable as a result.

Thus, accuracy in measurement (e.g., measurement of alignment where the target is used for alignment, measurement of overlay where the target is used for overlay measurement, etc.) can be significantly reduced by asymmetric structural deformation of one or more periodic structures (e.g., gratings) of the target. The measurement errors that arise from structural asymmetry may be corrected with changes to the process of creating or measuring the targets (e.g., process offsets) which are, for example, based on yield (i.e., evaluation of processed devices to determine whether the target was accurate), cross-sections of the target, or complex measurement and analytical reconstructions. However, these methods can be slow and/or destructive. They may only be effective to correct a constant asymmetry-induced process error. But, variation in structural asymmetry of the target is not effectively solved by cross-sections or yield measurements. Accordingly, there is a desire for, for example, a robust solution of evaluating and correcting for structural asymmetry that overcomes one or more of these or other limitations.

Therefore, it is desired to distinguish the contributions to measured target asymmetry that are caused by overlay and other effects in a more direct and simple way. So, in an embodiment, there is provided a robust computational approach that determines a measure of the asymmetric deformation of a target, which measure then may be used to correct measurements made using the target. Those measurements made using the target naturally may be used in creating, for example, devices by a lithographic process. Further, besides being used to correct measurements made using the target, the measure of the asymmetric deformation of the target may be used in the (re-)design of the target (e.g., making a change to a layout of the design), may be used in the process of forming the target (e.g., making a change in material, a change in printing steps or conditions, etc.), may be used in formulation of the measurement conditions (e.g., make a change in the optical measurement formulation in terms of wavelength, polarization, illumination mode, etc. of the measurement beam), etc.

An embodiment will be described in terms of +1st and −1st order diffraction-based measurement of a diffraction target used to measure overlay. Some of the principles of such a measurement technique have been described above. An embodiment of the invention, however, may apply to other measurement techniques using a target. For example, the techniques described herein may be applied to measurement of an alignment target.

As mentioned above, if the target is perfectly symmetric, then the detected intensity asymmetry ΔI between the +1st and −1st order radiation from the target is given by:

$$\Delta I(X) = I_1 - I_{-1} = K \sin\left(2\pi \frac{X}{P}\right) \quad (2)$$

where K is a process-dependent scale factor (a 1st harmonic proportionality constant), X is the lateral shift of a periodic structure (e.g., an upper or top grating) of the target relative to a periodic structure (e.g., a lower or bottom grating) of the target it overlays, and P is the pitch of the periodic structure. So, the overlay (OV) between 2 overlapping periodic structures may be obtained from the measured intensity asymmetry using 2 biased periodic structures as described above.

But now, consideration is made of a target that is not perfectly symmetric. And more specifically, an embodiment is described of an asymmetrically deformed lower periodic structure (e.g., a bottom grating) of the target. However, the techniques described herein may be applied to other or additional types of structural asymmetry of a target, such as a structural deformation in an upper periodic structure (e.g., a top grating) of the target.

Referring back to equation (2), the structural asymmetry introduces 2 additional terms in that equation. The first term is an offset, $K_{os}$, to the K constant of the measured intensity asymmetry. A second term is a positional offset, $X_{os}$, to the lateral shift X. So, in the presence of structural asymmetry of the target, the detected intensity asymmetry ΔI becomes:

$$\Delta I(X) = K_{os} + K \sin\left(2\pi \frac{X + X_{os}}{P}\right) \quad (3)$$

The additional terms $K_{os}$ and $X_{os}$ are stack-dependent (e.g., dependent on the material overlying, underneath or forming one or more of the periodic structures in the target) and recipe dependent (e.g., dependent on one or more parameters of the optical measurement such as wavelength, polarization, etc.).

Figure 9:
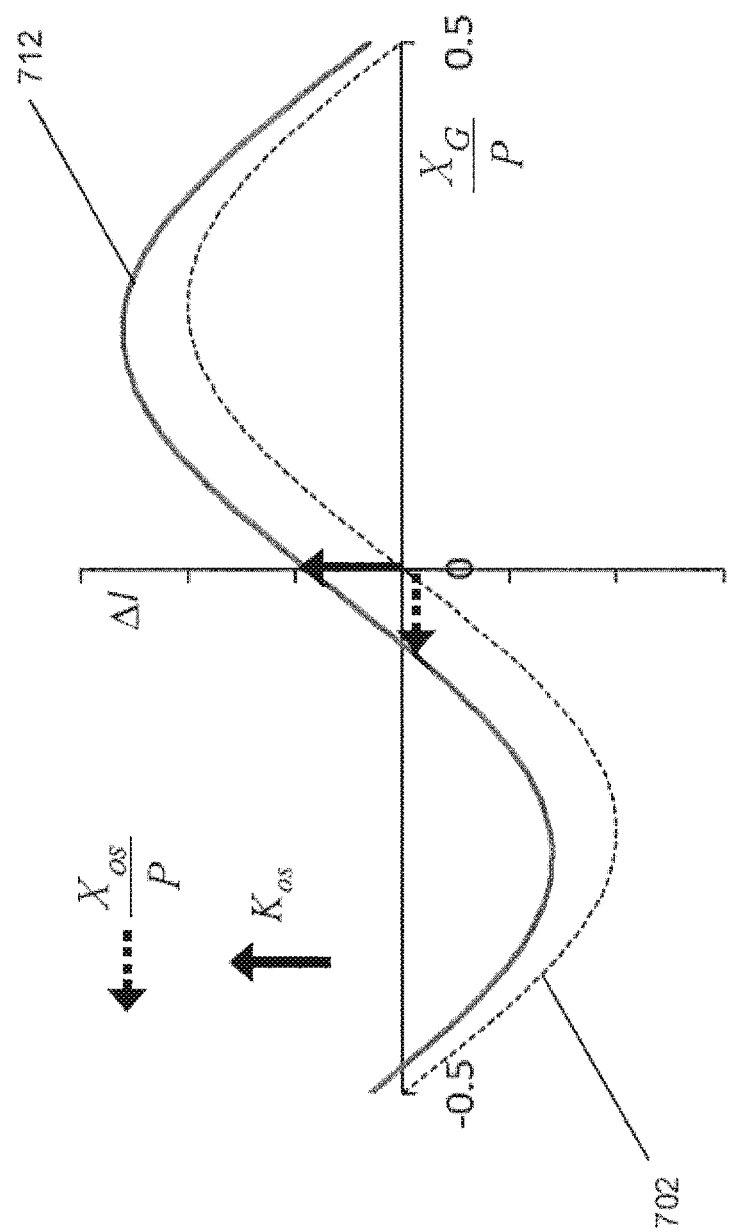
FIG. 9 illustrates the effects of structural asymmetry of the overlay measurement on overlay measurement of a target structure.

FIG. 9 shows an effect of structural asymmetry of the target, for example the structural asymmetry of the lower periodic structure illustrated in FIG. 7D. The 'ideal' sinusoidal curve 702 no longer applies. Instead, at least approximately, structural asymmetry has the effect of adding an offset, $K_{os}$, to the asymmetry value A or ΔI, which is relatively constant across all overlay values. Further, at least approximately, structural asymmetry has the effect of adding an offset, $X_{os}$, to the lateral shift values, where the effect of the offset is represented in FIG. 9 as $X_{os}/P$ and the lateral shift values are represented in FIG. 9 as $X_G/P$, where $X_G$ is the lateral shift (shown as X in equations (2) and (3)) and P is the pitch. The resulting curve is shown as 712 in FIG. 9.

Moreover, at the outset, the additional terms $K_{os}$ and $X_{os}$ are generally unknown. So it is desirable to ascertain them or some other related measure of the asymmetry.

The offset term $K_{os}$ can be determined by one or more various techniques. For example, for the lower periodic structure of the target, it can be directly measured using techniques described herein prior to an overlying layer, such as the upper periodic structure, is provided over the lower periodic structure.

As another example, the offset term $K_{os}$ can be calculated from measurements using, for example, composite periodic structures having three of more different bias values. That is, through such calculation, the $K_{os}$ term can be separated from the K term in equation (3). Examples of such a determination are described in PCT Patent Application Publication No. WO 2013/143814, U.S. Patent Application Publication No. 2013/0258310 and European Patent Application No. 13194522.2, each incorporated herein in its entirety by reference. For example, the offset term $K_{os}$ can be measured using at least 3 biased composite periodic structures with biases of −d, +d, and zero bias or 0.5P bias. As another example, the offset term $K_{os}$ can be measured using at least 4 biased composite periodic structures with biases −d, +d, −d+0.5P, and +d+0.5P.

The challenge is the determination of the offset $X_{os}$ since this term is added to the actual shift X. Therefore, it is not practically possible to decouple these terms without some context information.

Accordingly, in an embodiment, the target stack with the overlapping periodic structures is defined in a computational simulator that simulates the optical measurement of the target, i.e., the overlapping periodic structures, with a radiation beam defined in the simulator. Thus, there is established a parameterized model of the target in terms of a number of parameters $p_i$ ($p_1$, $p_2$, $p_3$ and so on). These parameters may represent for example, in a 1D periodic structure, the angle of a side wall, the height or depth of a feature, the width of the feature, etc. Properties of the target material and underlying/overlying layers are also represented by parameters such as refractive index (at a particular wavelength present in the measurement radiation beam). Further, parameters associated with the measurement beam and measurement such as wavelength, polarization, etc. may be defined. So, while the target may be defined by dozens of parameters, the model will define many of these to have fixed values, while others are to be variable or 'floating' parameters. Moreover, some of the floating parameters may be permitted to vary without being fully independent floating parameters.

Further, in the model, the parameters are provided the nominal dimensions of the periodic structures of the target, the nominal values of any materials (e.g., refractive indices, etc.), etc. along with values of the measurement recipe, namely the parameters associated with the measurement beam and measurement such as wavelength, polarization, etc. and then processed in the simulation. In an embodiment, the nominal values may include measured data. For example, the measured data may include optical measurements using a metrology apparatus and the nominal values are reconstructed from such measurements. In the simulation, the parameters representing the shape, together with the optical properties of the different elements of the model, are used to calculate scattering properties of the target, for example using a rigorous optical diffraction method such as RCWA or any other solver of Maxwell equations. This gives an estimated or model diffraction pattern of the target.

Further, in the simulation, the position of the upper periodic structure relative to the lower periodic structure that corresponds to X=0 is defined even though the structural asymmetry may make such a position not precisely defined. In an embodiment, a user (e.g., the device manufacturer) can give input to define this position based on, for example, a physical explanation or model of the process or other methods such as correlation to electrical overlay measurements or device yield. The position may be defined for example with knowledge of the intended structure shape (without any process-induced asymmetry). In an embodiment, the user may re-run the simulation again with a different definition of the position. The position may defined (or re-defined) such that measurement results from the target are within the tolerance of the device design. That is, for example, the position may defined (or re-defined) such that the overlay error is within at least the overlay budget for the device design, desirably well within the overlay budget.

Once the position corresponding to X=0 is defined, the simulator calculates, in an embodiment, values of ΔI for the given target stack and for one or more given structural asymmetries of the periodic structure. So, in an embodiment, the asymmetry-induced error may be calculated from an intensity delta (e.g., in the pupil plane or in the image plane) between plus and minus first diffraction orders, as determined at pixels across the detector (e.g., in the pupil or image plane). Where there is detection at the pupil plane, pixels may be identified that have a relatively large asymmetry-induced error for even a small amount of asymmetry; these pixels may be excluded from the calculation of the asymmetry-induced error for the whole pupil plane. The asymmetry-induced error may be calculated by a numerical calculation to simulate the particular measurement apparatus measurement on the model having the asymmetry. An embodiment of such a calculation is disclosed in U.S. Patent Application Publication 2006/0033921, which is incorporated by reference herein in its entirety. Further, the asymmetry-induced error may be calculated at the different lateral shift (different values of X) to account for differences in the asymmetry-induced error at such different lateral shifts. See, e.g., U.S. Patent Application Publication 2012/0013881, which is incorporated by reference herein in its entirety.

So, the simulator can apply one or more particular structural asymmetries to the given target stack to yield values of ΔI which can then be used to calculate (using, for example, equation (3)) the values of $K_{os}$ and $X_{os}$ that are caused by the particular structural asymmetry.

Further, the terms $K_{os}$ and $X_{os}$ are related (e.g., linearly related) to each other by a scale factor G:

$$X_{os} = G \times K_{os} \quad (4)$$

That is, the scale factor G can be determined from the calculated values of $K_{os}$ and $X_{os}$ from the simulation.

Accordingly, if the nature of the stack of the actual target is known and the "type" of the structural asymmetry of the actual target is known, the particular pertinent value of G from the simulation can be determined that relates to the actual target and that will be effective for the actual target. With the value of G from the simulation, equation (4) can be used to calculate the position shift $X_{os}$ for the actual target from a measured asymmetry offset $K_{os}$ relating to the actual target, which $K_{os}$ value can be calculated or measured using, for example, one or more the techniques described above.

So, there are at least two further considerations to arrive at the appropriate value of G from the simulation that is pertinent to the actual target—the nature of the stack of the actual target and the "type" of the structural asymmetry of the actual target. For example, the actual "type" (e.g., shape) of the asymmetry is usually not known a-priori. The structural asymmetry can be, for example, a sidewall angle asymmetry, a bottom surface angle asymmetry, a top surface angle asymmetry, some other type of asymmetry, or any combination thereof. In the case of segmented periodic structures (e.g., a grating have periodic lines and spaces wherein the lines themselves are further segmented in, e.g., the direction normal to the direction of periodicity), there may also need to be consideration of the possibility of asymmetry (unbalance) between different segments.

So, in an embodiment, the "type" of the asymmetry (asymmetry model) of the target is reconstructed from measurements of the actual target. For example, each type of asymmetry has a particular "fingerprint" of values of $K_{os}$ and/or overlay as a function of wavelength and polarization. So, measuring values of $K_{os}$ and/or overlay of the actual target for various measurement recipes, e.g., various wavelengths and/or polarizations (desirably also at various locations on the substrate) enables those measurements to be compared against the "fingerprints" to determine which "fingerprint" has the best fit to the measured $K_{os}$ and/or overlay variation and thus identify the structural asymmetry type.

FIG. 10(A) shows an example graph depicting the $K_{os}$ variation as a function of wavelength for TE polarization for 2 types of structural asymmetries in a FinFet stack—sidewall angle asymmetry shown by the line 1100 and spacer unbalance symmetry shown by the line 1102. FIG. 10(B) shows an example of sidewall angle asymmetry, where the sidewalls of features are not vertical as intended. The sidewall angle asymmetry can be, for example, induced by an etching step. FIG. 10(C) shows an example of spacer unbalance, where the space between at least one pair of features is different than spacing between at least one other pair of features. The spacer unbalance can be, for example, introduced by a spacer patterning step.

As can be seen in FIG. 10(A), these 2 types of structural asymmetry have significantly different variation across a range of wavelengths. This means that a multi-wavelength measurement can identify the type of structural asymmetry by comparison of those multi-wavelength measurements to the "fingerprints" to find a best fit to identify the "type" of structural asymmetry in the actual target. With knowledge of the "type" of structural asymmetry, the values of $K_{os}$ and $X_{os}$ from the simulation generated for the determined "type" of structural asymmetry can be used to derive the value of G using, for example, equation (4).

As will be appreciated, the data for the "fingerprints" can be obtained for different polarizations, illumination modes, etc. and/or for other structural asymmetries. Thus, in an embodiment, there could be a library of "fingerprints" of different specific structural asymmetries and combinations thereof, where the "fingerprints" are, for example, a collection of data or a construct representing the data, such a formula representing the data, a graph line representing the data, etc. While "fingerprints" are described for particular kinds (e.g., side wall angle, spacer unbalance, etc.) of structural asymmetries, the "fingerprints" may also represent a combination of different kinds of structural asymmetries (e.g., both side wall angle and spacer unbalance). Thus, a type of structural asymmetry is not limited to one kind of structural asymmetry, although in practice the structural asymmetry tends to be one kind, or dominated by one kind, of structural asymmetry.

Further, as described above, the nature of the actual stack may not be known with sufficient accuracy. Due to process changes (e.g., naturally induced or deliberately induced by the research and development phase of the device development since the target typically shares the material layers of the device), the actual stack for a target may be different from the nominal stack used in the simulation. In other words, there may be variations in the stack.

So, in an embodiment, a determination is made as to at which one or more recipes of the optical measurement the scale factor G has a low sensitivity (e.g., least sensitive) to process change, the recipe being a setting of the wavelength, the polarization, etc. of the optical measurement. That would mean, with that recipe, the asymmetry-induced position offset $X_{os}$ may be accurately calculated from the measured $K_{os}$ at that recipe even in the presence of stack variations.

A process change may include one or more selected from: a change in a stack material (e.g., a change in refractive index), a change in material thickness (e.g., a change in an overlying material), a change in the magnitude of a structural asymmetry, etc. In an embodiment, a process change may be any change in the stack other than the type of structural asymmetry itself as the type of structural asymmetry of a particular process generally remains fairly constant but changes in magnitude (e.g., a sidewall slope angle varies, a width of a spacer unbalance varies, etc.) of the structural asymmetry can occur.

To determine the sensitivity of G to process change, it is recognized from equation (4) that a change, $\Delta X_{os}$, in the position offset $X_{os}$ is caused by a combination of a process-induced change, $\Delta G$, in the scale factor G and an error, $\Delta K_{os}$, in the measured $K_{os}$ according to the following formula:

$$\Delta X_{os} = \Delta G \times K_{os} + G \times \Delta K_{os} \quad (5)$$

Figure 11A:
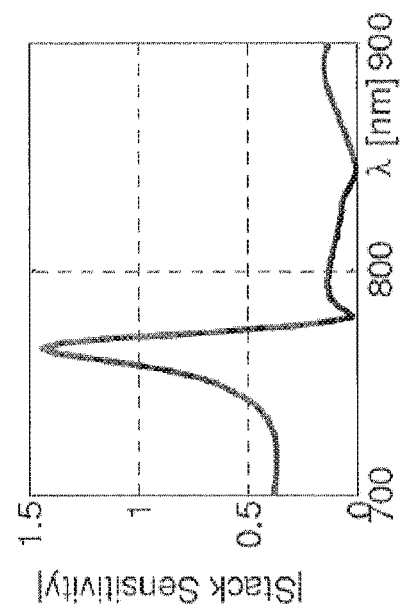
FIG. 11(A) is a graph showing simulated values of $\Delta G \cdot K_{os}$ (arbitrary units) as a function of wavelength of an optical measurement recipe.

Whereas the second term $G \times \Delta K_{os}$ is related to measurement error and can be corrected by, e.g., averaging or one or more other measurement error correction techniques, it is the first term, $\Delta G \times K_{os}$, that needs to be evaluated to determine for which recipe the scale factor G has a low sensitivity (e.g., a minimum sensitivity) to process change. To do so, the term, $\Delta G \times K_{os}$, is evaluated in the simulation against process changes. That is, perturbations (e.g., perturbations according to a Monte Carlo method) to process parameters are made in the simulation for a variety of different optical measurement recipes. FIG. 11(A) depicts an example graph showing simulated values of $\Delta G \cdot K_{os}$ (arbitrary units) as a function of wavelength, A, of the optical measurement recipe for a typical FinFET stack modeled in the simulation and subject to process change perturbations in the simulation. It can be seen that at a wavelength of about 720 nm, the variation in position error due to a stack variation is minimal. Thus, the asymmetry-induced position offset $X_{os}$ may be accurately calculated from the measured $K_{os}$ and the value of G from the simulator at that recipe, even in the presence of stack errors.

Figure 11B:
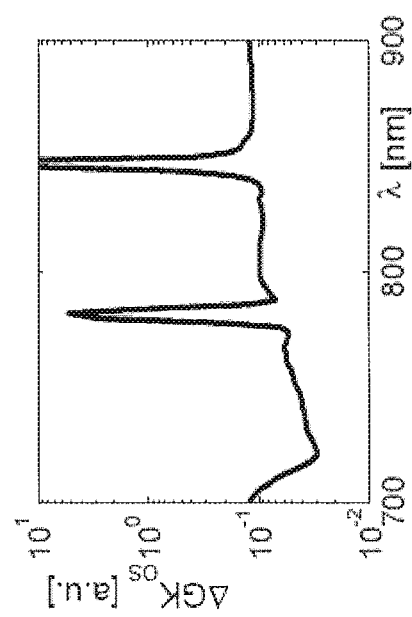
FIG. 11(B) is a graph depicting example values of stack sensitivity as a function of wavelength of an optical measurement recipe.

As a comparison, FIG. 11(B) depicts an example graph of the nominal stack sensitivity as a function of wavelength. Stack sensitivity can be understood as a measurement of how much the intensity of the signal changes as overlay changes because of diffraction between target (e.g., periodic structure such as grating) layers. It can be seen from FIG. 11(B) that the wavelength most robust to process change for purposes of asymmetry-induced position offset is not necessarily the wavelength with the highest stack sensitivity. Thus, if the wavelength of the optical measurement recipe was optimized for highest stack sensitivity (with the aim of achieving best total measurement uncertainty (TMU)), the recipe would achieve good TMU but have relatively poor asymmetry robustness.

Figure 12:
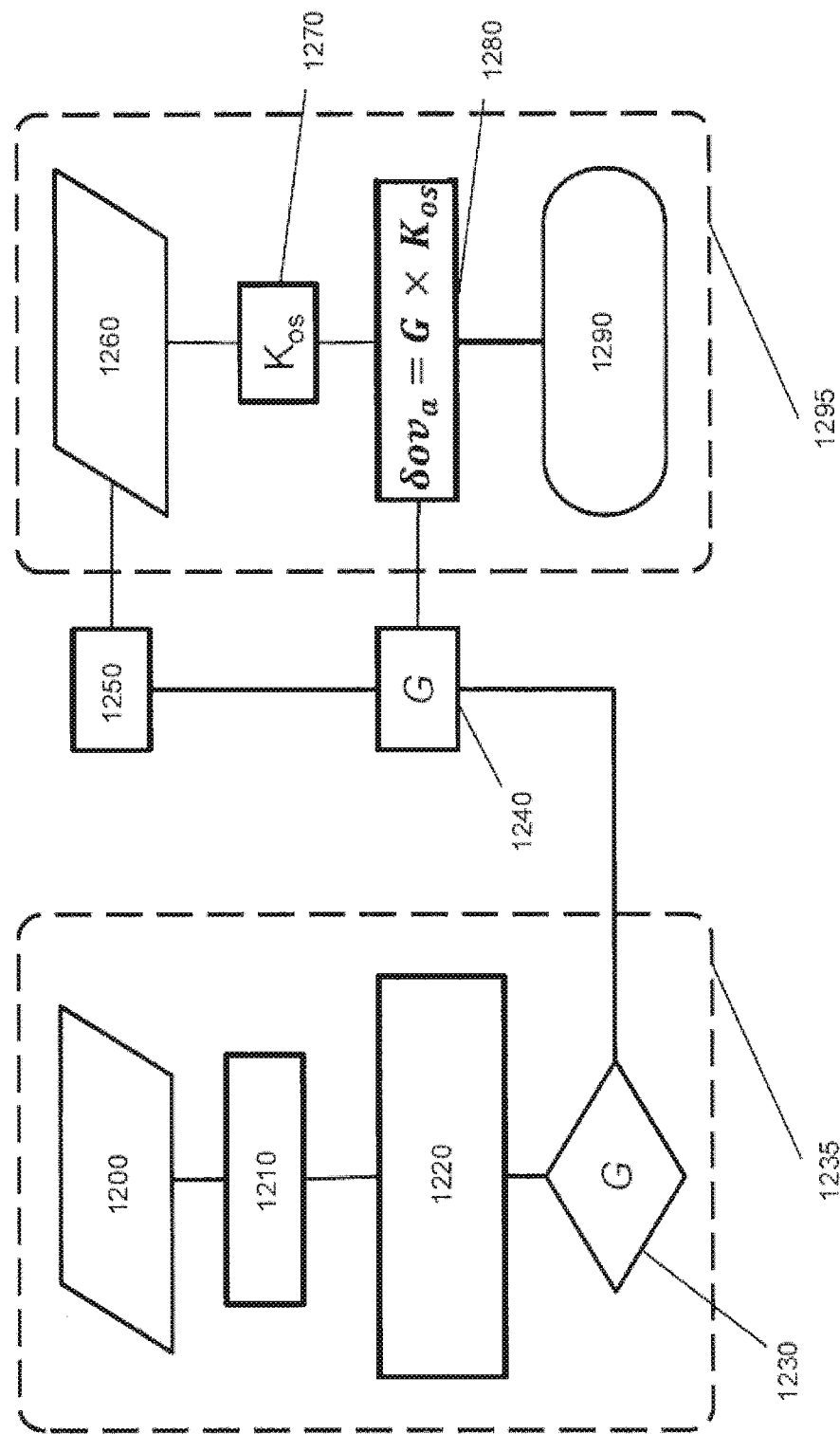
FIG. 12 depicts a flowchart illustrating a process of determining a structural asymmetry parameter and applying the asymmetry parameter according to an embodiment of the invention.

Referring to FIG. 12, a flowchart is provided that illustrates a method of determining a structural asymmetry parameter of a target and applying the asymmetry parameter according to an embodiment. At 1200, measurement data of the actual target is obtained. Such data can be diffraction-based measurement data as described herein.

At 1210, a stack tuning process is performed. In an embodiment, the measurement data is evaluated to determine a type of asymmetry of the actual target. In an embodiment, determining the type of structural asymmetry of the target comprises evaluating determined values of overlay from measurement of the target or of a process-dependent scale factor offset due to the asymmetry, e.g., $K_{os}$, from measurement of the target, as a function of a parameter of the optical measurement. In an embodiment, the parameter of optical measurement comprises wavelength and/or polarization of a measurement beam of the optical measurement. In an embodiment, evaluating the determined values comprises determining a fit between (i) the determined values, or a construct representing the determined values (e.g., a formula, line, etc.), and (ii) one or more fingerprint sets of values of the overlay or process-dependent scale factor offset as a function of the parameter of the optical measurement, or one or more fingerprint constructs representing the fingerprint sets of values, each fingerprint set or fingerprint construct representing a different type of asymmetry. So, as described above, in an embodiment, such evaluation may involve comparing measured values of overlay or $K_{os}$ of the actual target for various measurement recipes, e.g., various wavelengths and/or polarizations, to one or more "fingerprints" of overlay or $K_{os}$ as a function of wavelength and/or polarization that respectively identify particular types of structural asymmetry in order to determine which "fingerprint" has the best fit to the measured overlay or $K_{os}$ variation and thus identify the structural asymmetry type.

Further, a simulation of the optical measurement of a simulated representation of the target is performed to determine a value of an asymmetry parameter (1230) associated with the asymmetry type. In an embodiment, a value of a process-dependent scale factor offset, due to the asymmetry, of a measurement using the target, e.g., $K_{os}$, and a value of a positional offset, due the asymmetry, of a measurement using the target, e.g., $X_{os}$, is determined from the simulation. In an embodiment, as described above, the simulator calculates values of $\Delta I$ for the given target stack and for one or more given structural asymmetries of the periodic structure. That is, the simulator can apply one or more particular structural asymmetries to the given target stack to yield values of $\Delta I$ which can then be used to calculate (using, for example, equation (3)) the values of $K_{os}$ and $X_{os}$ that are caused by the particular structural asymmetry. In an embodiment, the simulation of the optical measurement of overlying periodic structures is set at a lateral shift of zero for a specified asymmetry. Thus, the determined asymmetry type can be used to define the given structural asymmetry for the simulation or to select the desired data from among a plurality of simulated structural asymmetries.

Thus, from the values of $K_{os}$ and $X_{os}$, an asymmetry parameter (1230) can be determined, such as scale factor G which relates a positional offset, due the asymmetry, of a measurement using the target, e.g., $X_{os}$, to a process-dependent scale factor offset, due to the asymmetry, of measurement using the target, e.g., $K_{os}$. The asymmetry parameter, e.g., scale factor G, can be used in making corrections, designing a target, etc. In an embodiment, the asymmetry parameter may be a positional offset, due the asymmetry, of a measurement using the target, e.g. a value of $X_{os}$. In an embodiment, the positional offset is determined using a scale factor G as described above and a measured value of a process-dependent scale factor offset, due to the asymmetry, of measurement using the target, e.g., a measured value of $K_{os}$.

At 1220, a process robustness evaluation is performed. In an embodiment, a sensitivity of the asymmetry parameter to change in a target formation parameter associated with the target is analyzed. That is, in an embodiment, a determination is made as to at which one or more recipes of the optical measurement (the recipe being a setting of the wavelength, the polarization, etc. of the optical measurement) the asymmetry parameter (e.g., scale factor G) has a low sensitivity (e.g., least sensitive) to change in a target formation parameter (e.g., a process change). Thus, in an embodiment, the analysis of the sensitivity comprises determining a value of a parameter of the optical measurement, e.g., wavelength and/or polarization of a measurement beam of the optical measurement, for a minimum value of the sensitivity of the asymmetry parameter to change in the target formation parameter. In an embodiment, the analyzing comprises performing a simulation. For example, the term, $\Delta G \times K_{os}$, is evaluated in the simulation against process changes. That is, perturbations to process parameters are made in the simulation for a variety of different optical measurement recipes and the recipe having, e.g., the lowest value of $\Delta G \times K_{os}$, is used to select the recipe for measurement of the actual target and to select the asymmetry parameter from the simulation, e.g., the particular value of G.

At 1230, the determined asymmetry parameter, in this case the scale factor G, is provided for use in corrections of measurements, in design of a target, etc. As shown by 1235, the stack tuning and/or process robustness analysis may be performed in a preparation or development stage prior to the target being used in volume manufacturing. Additionally or alternatively, the stack tuning and/or process robustness analysis may be performed during volume manufacturing. In such a case, the measurement data may come from, e.g., sparse sampling of the target to facilitate throughput.

An example use of the determined asymmetry parameter, in this case the scale factor G, to correct measurements of an actual target is depicted at 1295. That is, in an embodiment, the determined asymmetry parameter is applied to measurements of a target made during high-volume manufacturing. In an embodiment, the measurements may be from dense sampling of the target. Thus, in an embodiment, the determined asymmetry parameter may be fed forward to the process of making measurements of the actual target. Further, a recipe of the optical measurement (the recipe being a setting of the wavelength, the polarization, etc. of the optical measurement) at which the asymmetry parameter (e.g., scale factor G) has a low sensitivity (e.g., least sensitive) to change in a target formation parameter (e.g., a process change) may be fed forward to the process of making measurements of the actual target.

At 1260, measurement data of the actual target is obtained using, for example, a recipe 1250 of the optical measurement (the recipe being a setting of the wavelength, the polarization, etc. of the optical measurement) at which the asymmetry parameter (e.g., scale factor G) has a low sensitivity (e.g., least sensitive) to change in a target formation parameter (e.g., a process change). Such data can be diffraction-based measurement data as described herein. That measurement data is taken using the optical measurement recipe (the recipe being a setting of the wavelength, the polarization, etc. of the optical measurement) for which the asymmetry parameter (e.g., scale factor G) has a low sensitivity (e.g., least sensitive) to change in a target formation parameter (e.g., a process change) as determined, e.g., in the process robustness analysis 1220. As described hereafter, the measurement data may comprise measurement data captured using, for example, composite periodic structures having three of more different bias values.

At 1270, from the measurement data, a value of a process-dependent scale factor offset, due to the asymmetry, of a measurement using the target, e.g., $K_{os}$, is determined. As described above, the value of the process-dependent scale factor offset can be determined using one or more various techniques. For example, as described above, it can be determined from measurement data using, for example, composite periodic structures having three of more different bias values.

At 1280, the asymmetry parameter 1240, e.g., the scale factor G, is used to determine an effect of the structural asymmetry on a measurement of the actual target. In an embodiment, the asymmetry parameter, e.g., the scale factor G, is combined with the value of the process-dependent scale factor offset 1270. That is, equation (4) may be used to arrive at the positional shift due to the structural asymmetry, e.g., $X_{os}$. Where the measurement of the target is to measure overlay ov of the actual target, the positional shift translates to a change in the actual overlay, e.g., $\delta ov_a$. Thus, at 1290, the overlay measurement may be corrected to account for the structural asymmetry.

The process stack for a certain layer can change significantly beyond the nominal. A typical existing target cannot handle a large change in the process stack (i.e., a process change). Further, a typical diffraction-based overlay target is used to measure overlay between a pair of layers. But, there is a need to do overlay measurements between not only a single layer pair but among multiple layer pairs. So, according to an embodiment, there is provided a diffraction metrology target comprising a multi-grating target-cluster (a single cluster of gratings) that is small in total size, but includes a set of multi-design gratings; for convenience of reference, this target is referred to as an extended operating range metrology target. The techniques described herein may be applied to an extended operating range metrology target.

For, e.g., process development, a sub-set of gratings from the extended operating range metrology target can be used for a certain process stack condition while another sub-set(s) of gratings from the extended operating range metrology target can be used for another process stack condition thus being able to account for significant variations in the process stack. Alternatively or additionally, for, e.g., multi-layer overlay, a sub-set of gratings from the extended operating range metrology target can be used for a certain layer-pair while another sub-set(s) of the extended operating range metrology target can be used for another layer-pair thus enabling multi-layer overlay.

Thus, in the situation of significant process stack variation (e.g., variation of the process stack that can't be properly handled by a particular grating design of a metrology target), the extended operating range metrology target allows putting significantly different designs (all within a reasonable size of a target) that will increase the chance of successful measurement results if a change is made to the process stack. This could increase the chance of first time measurement success due the presence of different designs pro-actively anticipating for process stack variations. And, in the situation of multi-overlay measurement, the extended operating range metrology target allows measuring of overlay between multiple layers in one measurement sequence. That is, in an embodiment, multiple layer pairs can be measured in one measurement sequence and in an embodiment, the diffraction data of multiple layer pairs can be detected simultaneously.

By having the differently designed gratings in the extended operating range metrology target, significant variations in the process stack and/or multi-layer can be handled by a single metrology target with differently designed sets of gratings therein. Thereby, the cost of creating different patterning devices (e.g., masks) for each different individual target and/or the cost of measuring time can be significantly reduced. Further, by the relatively small size of the extended operating range metrology target, the cost of target "real estate" (i.e., available space on the patterning device pattern to accommodate these individual layer-pair targets) for multiple different individual targets and the cost of throughput due to the increased measurement times may be significantly reduced. So, the extended operating range metrology target can bring all these multiple targets within a single target-cluster that is small enough from a real-estate point of view and also more favorable in terms of measurement time compared to multiple individual targets.

Figure 13:
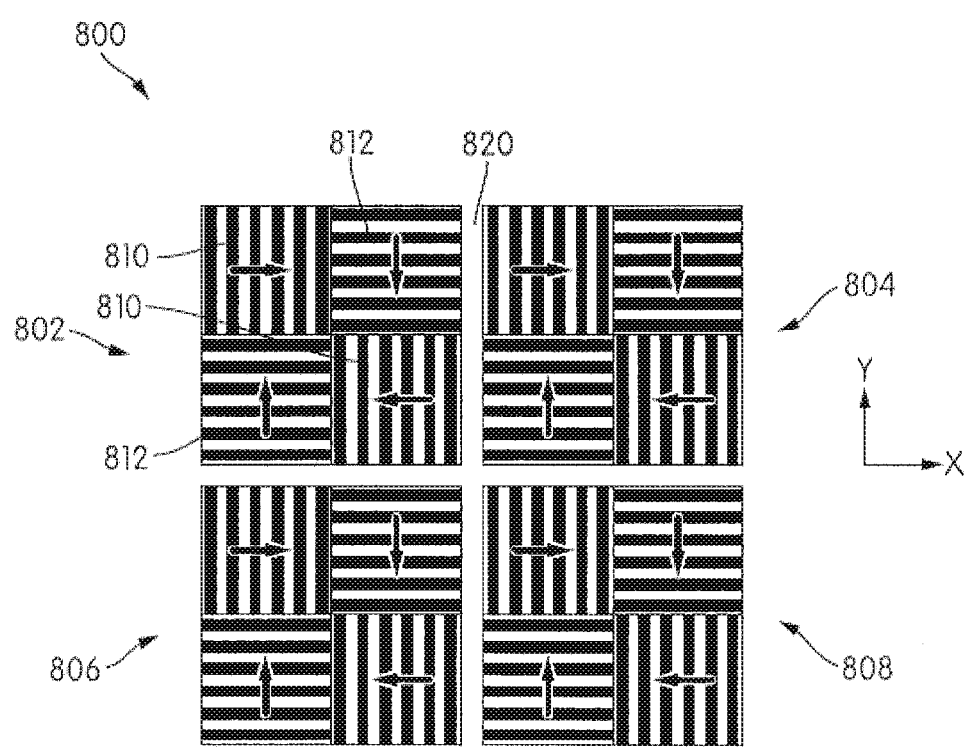
FIG. 13 illustrates an extended operating range metrology target according to an embodiment of the invention.

Referring to FIG. 13, an embodiment of an extended operating range metrology target 800 is depicted. The extended operating range metrology target 800 comprises a plurality of sub-targets, in this example, four diffraction sub-targets 802, 804, 806, 808. As will be appreciated, a different number of sub-targets may be provided. For example, just two sub-targets may be provided. Alternatively, three, five, six, seven, eight, etc. sub-targets may be provided. In an embodiment, each sub-target 802-808 is separated from a neighboring sub-target by a gap 820. In an embodiment, the gap is 200 nm or more, 250 nm or more, 350 nm or more, 500 nm or more, 750 nm or more, or 1 µm or more. The gap facilitates reconstruction of the sub-targets so that they can be separately identified. Further, the gap may help prevent cross-talk of diffraction from one sub-target extending over to another sub-target.

Each sub-target comprises a periodic structure. In an embodiment, each sub-target comprises at least a pair of periodic structures. In an embodiment, each sub-target comprises at least two pairs of periodic structures. In an embodiment, the features (e.g., lines) of the periodic structures in a sub-target extend in a same direction. In an embodiment, at least one periodic structure of a sub-target may have lines extending in a direction substantially perpendicular to the direction in which the lines of another periodic structure of the sub-target extend. In an embodiment, the direction(s) in which features of periodic structures of one sub-target extend may be different from that of another sub-target.

In an embodiment, as shown in FIG. 13, each sub-target has a first pair of periodic structures 810 having lines extending in a first direction and a second pair of periodic structures 812 having lines extending in a second direction substantially perpendicular to the first direction. In this example, each sub-target 802-808 has a similar overall layout as the target of FIG. 4. That is, each sub-target has a first pair of gratings with lines extending in the X-direction in opposite corners and a second pair of gratings with lines extending in the Y-direction in opposite corners to the first pair of gratings. However, the layout of the sub-targets may be different than as depicted in FIG. 13. For example, the locations of the periodic structures may be different. As another example, the length and/or width of one pair of periodic structures may be different than the length and/or width of another pair of periodic structures.

The sub-targets 802-808 have a size such that they can fully or at least partly fit within the same contiguous area as the target of FIG. 4. For example, the extended operating range metrology target 800 may have outer dimensions within or equal to 25 µm×25 µm, within or equal to 20 µm×20 µm, within or equal to 16 µm×16 µm, within or equal to 12 µm×12 µm, within or equal to 10 µm×10 µm, or within or equal to 8 µm×8 µm. In an embodiment, at least part of each sub-target is within a contiguous area of a certain size on the substrate. In an embodiment, at least part of each periodic structure of the plurality of sub-targets is within the contiguous area of the certain size on the substrate. In an embodiment, each periodic structure of the plurality of sub-targets is within the contiguous area of the certain size on the substrate. In an embodiment, the certain size is less than or equal to 1000 µm², less than or equal to 900 µm², less than or equal to 800 µm², less than or equal to 700 µm², less than or equal to 600 µm², less than or equal to 500 µm², less than or equal to 450 µm², less than or equal to 400 µm², less than or equal to 350 µm², less than or equal to 300 µm², less than or equal to 250 µm², less than or equal to 200 µm², less than or equal to 150 µm², or less than or equal to 100 µm². In an embodiment, each of the periodic structures of the sub-targets 802-808 is no smaller than about 3 µm×3 µm or no smaller than about 4 µm×4 µm. In an embodiment, each of the periodic structures of the sub-targets 802-808 is no smaller than about 9 µm² or no smaller than about 16 µm².

In an embodiment, at least part of each of sub-target is within the area of the measurement spot (e.g., within the width of the measurement spot) on the substrate. In an embodiment, at least part of each periodic structure of the plurality of sub-targets is within the area of the measurement spot (e.g., within the width of the measurement spot) on the substrate. In an embodiment, each periodic structure of the plurality of sub-targets is within the area of the measurement spot (e.g., within the width of the measurement spot) on the substrate. In an embodiment, the measurement spot has a width (e.g., diameter) of about 35 µm or less, of about 30 µm or less, of about 25 µm or less, or of about 20 µm or less, of about 15 µm or less, or of about 10 µm or less. So, in an embodiment, multiple sub-targets can be measured in one measurement sequence and in an embodiment, the diffraction data of multiple sub-targets can be detected simultaneously.

Like with the target of FIG. 4, a plurality of the sub-targets at least partly overlay another periodic structure (which other periodic structure is not shown in FIG. 13 merely for clarity). In an embodiment, each of the sub-targets 802-806 at least partly overlays a respective periodic structure. In an embodiment, a first extended operating range metrology target 800 overlays a second extended operating range metrology target 800. In that case, each of the plurality of the sub-targets 802-806 of the first extended operating range metrology target 800 would overlay respective sub-targets 802-806 of the second extended operating range metrology target 800. In an embodiment, the first extended operating range metrology target 800 may be in one layer and the second extended operating range metrology target 800 may be one other layer. In an embodiment, the first extended operating range metrology target 800 may be in one layer and the second extended operating range metrology target 800 may have each of a plurality of sub-targets in different layers.

Further, besides multiple sub-targets being created within a single layout, each of a plurality of the sub-targets is designed for (a) a different process condition, and/or (b) a different layer-pair for multi-layer overlay. In other words, in an embodiment, a first sub-target 802 of the plurality of sub-targets has a different design than a second sub-target 804 of the plurality of sub-targets. In an embodiment, each of the sub-targets 802-808 may have a different design. In an embodiment, two or more sub-targets 802, 808 of the plurality of sub-targets may have a different design than two or more other sub-targets 804, 806 of the plurality of sub-targets.

Figure 14:
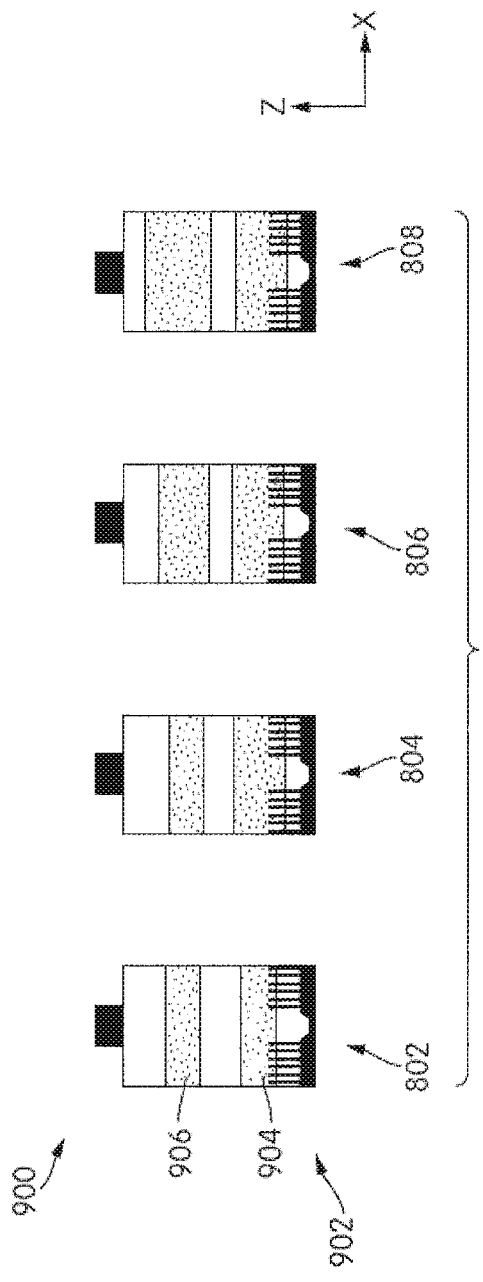
FIG. 14 illustrates use of an extended operating range metrology target according to an embodiment of the invention to account for process stack variation.

Referring to FIG. 14, the use of an example of an extended operating range metrology target 900, 902 (of the design of FIG. 13) having a plurality of sub-targets designed for different process conditions is depicted. For ease of reference, the sub-targets 802, 804, 806, 808 are depicted in a row in FIG. 14. As will be appreciated from the layout of FIG. 13, the sub-targets 806, 808 in FIG. 14 would in practice be located in "front" or "behind" the sub-targets 802, 804 in FIG. 14, i.e., in or out of the page respectively. Further, in this embodiment, the first extended operating range metrology target 900 is at one layer and the second extended operating range metrology target 902 is at one other layer. That is, in FIG. 14, each of the sub-targets 802, 804, 806, 808 of the first extended operating range metrology target 900 is at a top layer and each of the sub-targets 802, 804, 806, 808 of the second extended operating range metrology target 902 is in a single layer underneath the first extended operating range metrology target 900, such that each of the sub-targets 802, 804, 806, 808 of the first extended operating range metrology target 900 at least partly overlays a respective sub-target 802, 804, 806, 808 of the second extended operating range metrology target 902.

In the example of FIG. 14, each of the sub-targets 802, 804, 806, 808 is designed for a different process stack. In this example, sub-target 802 is designed for a process stack having a first layer 904 of 100 nm and a second layer 906 of 100 nm, sub-target 804 is designed for a different process stack having a first layer 904 of 100 nm and a second layer 906 of 110 nm, sub-target 806 is designed for a different process stack having a first layer 904 of 110 nm and a second layer 906 of 110 nm, and sub-target 808 is designed for a process stack having a first layer 904 of 120 nm and a second layer 906 of 110 nm. As will be appreciated, the conditions of the different process stacks may be different than those used in this example. For example, the process conditions can be other than layer thicknesses. Other process conditions may include refractive index, layer material, etch rate, bake temperature, exposure focus, exposure dose, etc. Further, while in this embodiment, the extended operating range metrology target 900 is differently designed than the associated extended operating range metrology target 902 which it overlays (e.g., in FIG. 14, the grating lines in the extended operating range metrology target 902 are segmented, while those in the extended operating range metrology target 900 are not), the extended operating range metrology target 900 and the extended operating range metrology target 902 may be the same. Further, while 4 different process stacks are capable of being successfully measured in FIG. 14, there may be a different number of process stacks that could be capable of being successfully measured.

In terms of difference in design, the difference is, in an embodiment, a difference in pitch of the periodic structures between at least one of the sub-targets 802, 804, 806, 808 and another of the sub-targets 802, 804, 806, 808. In an embodiment, the pitch is selected from the range of 100 nm to 1000 nm. In an embodiment, the difference in design is a difference in feature (e.g., line) or space width of the periodic structures between at least one of the sub-targets 802, 804, 806, 808 and another of the sub-targets 802, 804, 806, 808. In an embodiment, the difference in design is a difference in segmentation of features of the periodic structures (e.g., a broken line, rather than a solid line) between at least one of the sub-targets 802, 804, 806, 808 and another of the sub-targets 802, 804, 806, 808. In an embodiment, the difference in design is a difference in bias (e.g., amount and/or direction) of the periodic structures between at least one of the sub-targets 802, 804, 806, 808 and another of the sub-targets 802, 804, 806, 808. In an embodiment, the bias is selected in the range of 1 nm to 60 nm. The arrows depict an embodiment of the direction of bias. To be sure a bias is not required. In an embodiment, the difference in design is a difference in line or space width between overlying extended operating range metrology targets (e.g., a difference in "top and bottom CD"), e.g., a line or space width of at least one of the sub-targets 802, 804, 806, 808 of a first extended operating range metrology target is different than the line or space width of at least one of the sub-targets 802, 804, 806, 808 of an overlying second extended operating range metrology target. In an embodiment, the difference in design is a difference in layout of the sub-targets 802, 804, 806, 808 and their associated periodic structures. In an embodiment, the difference in design is a difference in optimum wavelength for the measuring beam between at least one of the sub-targets 802, 804, 806, 808 and another of the sub-targets 802, 804, 806, 808. Where the same wavelength measurement recipe is used for each of the sub-targets 802, 804, 806, 808, the sub-targets 802, 804, 806, 808 may be optimized to accept a minimal performance loss on each sub-target. Or, in an embodiment, multiple wavelengths may be used for the plurality of sub-targets or wavelengths may be separated out of broadband radiation applied to the sub-targets. As will be appreciated, a combination of design parameters may be used.

So, in an embodiment, the extended operating range metrology targets 900, 902 may be provided, in a first example, to a process stack that has the characteristics of sub-target 802, namely a process stack having a first layer 904 of 100 nm and a second layer 906 of 100 nm. Accordingly, when the measurements of those extended operating range metrology targets 900, 902 are made, the measurement results from sub-target 802 will be good for that process stack while the measurement results from sub-targets 804, 806, and 808 will be less so. But, conveniently, the same extended operating range metrology targets 900, 902 may be provided, in a second example, to a process stack that has the characteristics of sub-target 804, namely a process stack having a first layer 904 of 100 nm and a second layer 906 of 110 nm. Accordingly, when the measurements of those extended operating range metrology targets 900, 902 are made in this different process stack, the measurement results from sub-target 804 in this case will be good for that process stack while the measurement results from sub-targets 802, 806, and 808 will be less so.

To determine whether the measurement results are good, one or more different techniques may be used. For example, in the first example mentioned above, there may simply not be any or significantly weaker measurement results from sub-targets 804, 806, and 808 because they are effectively unmeasurable. In another example, a residual (e.g., an overlay residual) can be measured for each of the sub-targets and a lower or lowest residual for one of the sub-targets may signify that the measurement results from the sub-target are good. In another example, the same parameter (e.g., overlay) may be measured by another process. As an example, an electrical test may be performed to determine a value for the parameter and the sub-target with the nearest value to that measured by the electrical test may signify that the measurement results from the sub-target are good.

Figure 15:
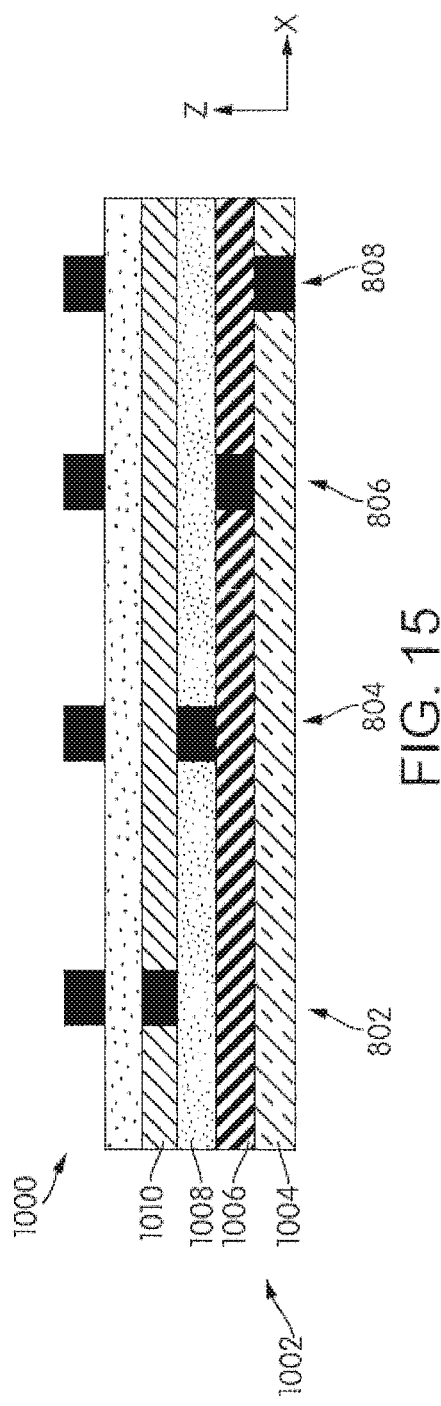
FIG. 15 illustrates use of an extended operating range metrology target according to an embodiment of the invention for multiple layer overlay measurement.

Referring to FIG. 15, the use of an example of an extended operating range metrology target 1000, 1002 (of the design of FIG. 13) having a plurality of sub-targets for multi-layer overlay is depicted. For ease of reference, the sub-targets 802, 804, 806, 808 are depicted in a row in FIG. 15. As will be appreciated from the layout of FIG. 13, the sub-targets 806, 808 in FIG. 15 would in practice be located in "front" or "behind" the sub-targets 802, 804 in FIG. 15, i.e., in or out of the page respectively. Further, in this embodiment, the first extended operating range metrology target 900 is at one layer and the second extended operating range metrology target 902 has each of a plurality of sub-targets in different layers. That is, in FIG. 15, each of the sub-targets 802, 804, 806, 808 of the first extended operating range metrology target 900 is at a top layer and each of the sub-targets 802, 804, 806, 808 of the second extended operating range metrology target 902 is in a different layer underneath the first extended operating range metrology target 900, such that each of the sub-targets 802, 804, 806, 808 of the first extended operating range metrology target 900 at least partly overlays a respective sub-target 802, 804, 806, 808 of the second extended operating range metrology target 902.

In the example of FIG. 15, each of the sub-targets 802, 804, 806, 808 is designed for a different layer. In this example, sub-target 802 is designed for measuring overlay for a first layer-pair of the top layer and layer 1010, sub-target 804 is designed for measuring overlay for a second layer-pair of the top layer and layer 1008, sub-target 806 is designed for measuring overlay for a third layer-pair of the top layer and layer 1006, and sub-target 808 is designed for measuring overlay for a fourth layer-pair of the top layer and layer 1004. While each sub-target in this example measures a different layer-pair, in an embodiment, two or more of the sub-targets may measure a first layer-pair and one or more other sub-targets may measure a second layer-pair. Further, while 4 different layer-pairs are capable of being measured in FIG. 15, there may be a different number of layer-pairs capable of being measured.

In this embodiment, each of the sub-targets 802, 804, 806, 808 of the first extended operating range metrology target 900 has a same design and the sub-targets 802, 804, 806, 808 of the first extended operating range metrology target 900 is the same in terms of design as the sub-targets 802, 804, 806, 808 of the second extended operating range metrology target 902. However, as noted above, two or more of the sub-targets 802, 804, 806, 808 of the second extended operating range metrology target 902 are in different layers, while still underlying the first extended operating range metrology target 900. In an embodiment, one or more of the sub-targets 802, 804, 806, 808 of the first extended operating range metrology target 900 may have a different design than another one or more of the sub-targets 802, 804, 806, 808 of the first extended operating range metrology target 900. In an embodiment, one or more of the sub-targets 802, 804, 806, 808 of the first extended operating range metrology target 900 may have a different design than one or more of the sub-targets 802, 804, 806, 808 of the second extended operating range metrology target 902.

In an embodiment, because of the location of each of the sub-targets 802, 804, 806, 808 in the extended operating range metrology target, the overlay for each specific different layer-pair can be readily made. Moreover, since the extended operating range metrology target has sub-targets 802, 804, 806, 808 for each different layer-pair, the measurement of a plurality of different layer-pairs may be taken in one measurement sequence, e.g., the diffraction information each of the different layer-pairs may be captured at once. Instead of or in addition to using the measured overlay value of each different layer-pair separately, the average, median or other statistical value of the measurements using the sub-targets 802, 804, 806, 808 may be used for process control. This may be useful where there is a concern over the specific reliability of one or more of the sub-targets 802, 804, 806, 808 due their smallness. The statistical value can help eliminate anomalies.

The extended operating range metrology target can thus open up a new way of working with metrology targets in, e.g., the process development phase and multi-layer overlay measurement. In advanced nodes (with, e.g., difficult and varying processes and/or multiple layers for multi-patterning (e.g., double patterning)), device designers and manufacturers are dynamically changing process stacks and/or using multiple layers and expect that metrology will work. The extended operating range metrology target can thus bring more process robustness to metrology measurements and increase the chance of first-time-success of metrology on a relatively unknown process stack. For example, a benefit from measurement speed can be realized if at least part of each of sub-target of the extended operating range metrology target is within the area of the measurement spot. If so, the extended operating range metrology target can, for example, increase the chance of first time success with metrology on a process stack where process conditions may be unknown. Further, the extended operating range metrology target can enable quick measurement of multiple layers and/or handle significant variations in the process stack with reduced cost in the terms of target "real estate", patterning device manufacture and/or throughput. And, the extended operating range metrology target may be used at development and/or manufacturing sites using existing metrology apparatus and no sensor hardware change may be required.

In an embodiment, there is provided a system and method to design the metrology target. In an embodiment, the metrology target should be suited to different process stacks expected and/or the measurement desired. Further, the metrology target should be able to cover for typical process variations (which are different than the significant differences from different process stacks). Accordingly, in an embodiment, a design methodology is employed to help ensure robustness of the metrology target. That is, the metrology target, including its associated periodic structures, can be designed by calculation and/or simulation using process stack information to help ensure robustness of the metrology target. For example, for an extended operating range metrology target for different process stacks, the robustness of each sub-target of the extended operating range metrology target can be determined for the expected typical process variation associated with the particular different process stack associated with the sub-target.

As noted above, proposed metrology target designs may be subject to testing and/or simulation in order to confirm their suitability and/or viability, both from a printability and a detectability standpoint. In a commercial environment, good overlay mark detectability may be considered to be a combination of low total measurement uncertainty as well as a short move-acquire-move time, as slow acquisition is detrimental to total throughput for the production line. Modern micro-diffraction-based-overlay targets (pDBO) may be on the order of 10-20 µm on a side, which provides an inherently low detection signal compared to 40×160 µm$^2$ targets such as those used in the context of monitor substrates.

Additionally, once metrology targets that meet the above criteria have been selected, there is a possibility that detectability will change with respect to typical process variations, such as film thickness variation, various etch biases, and geometry asymmetries induced by the etch and/or polish processes. Therefore, it may be useful to select a target that has low detectability variation and low overlay/alignment variation against various process variations. Likewise, the fingerprint (printing characteristics, including, for example, lens aberration) of the specific machine that is to be used to produce the microelectronic device to be imaged will, in general, affect the imaging and production of the metrology targets. It may therefore be useful to ensure that the metrology targets are resistant to fingerprint effects, as some patterns will be more or less affected by a particular lithographic fingerprint.

Accordingly, in an embodiment, there is provided a method to design a metrology target. In an embodiment, it is desirable to simulate various metrology target designs in order to confirm the suitability and/or viability of one or more of the proposed metrology target designs.

Figure 16:
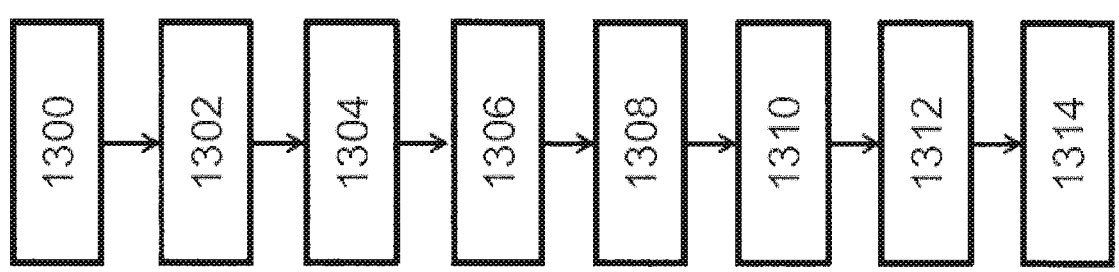
FIG. 16 schematically depicts a system for designing a metrology target according to an embodiment of the invention.

In a system for simulating a manufacturing process involving lithography and metrology targets, the major manufacturing system components and/or processes can be described by various functional modules, for example, as illustrated in FIG. 16. Referring to FIG. 16, the functional modules may include a design layout module 1300, which defines a metrology target (and/or microelectronic device) design pattern; a patterning device layout module 1302, which defines how the patterning device pattern is laid out in polygons based on the target design; a patterning device model module 1304, which models the physical properties of the pixilated and continuous-tone patterning device to be utilized during the simulation process; an optical model module 1306, which defines the performance of the optical components of the lithography system; a resist model module 1308, which defines the performance of the resist being utilized in the given process; a process model module 1310, which defines performance of the post-resist development processes (e.g., etch); and a metrology module 1312, which defines the performance of a metrology system used with the metrology target and thus the performance of the metrology target when used with the metrology system. The results of one or more of the simulation modules, for example, predicted contours and CDs, are provided in a result module 1314.

The properties of the illumination and projection optics are captured in the optical model module 1306 that includes, but is not limited to, NA-sigma ($\sigma$) settings as well as any particular illumination source shape, where $\sigma$ (or sigma) is outer radial extent of the illuminator. The optical properties of the photo-resist layer coated on a substrate—i.e. refractive index, film thickness, propagation and polarization effects—may also be captured as part of the optical model module 1306, whereas the resist model module 1308 describes the effects of chemical processes which occur during resist exposure, post exposure bake (PEB) and development, in order to predict, for example, contours of resist features formed on the substrate. The patterning device model module 1304 captures how the target design features are laid out in the pattern of the patterning device and may include a representation of detailed physical properties of the patterning device, as described, for example, in U.S. Pat. No. 7,587,704. The objective of the simulation is to accurately predict, for example, edge placements and CDs, which can then be compared against the target design. The target design is generally defined as the pre-OPC patterning device layout, and will be provided in a standardized digital file format such as GDSII or OASIS.

In general, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of photons, which is further modified by diffusion processes and various loading effects. Efficient simulation methods that are fast enough for full-chip applications approximate the realistic 3-dimensional intensity distribution in the resist stack by a 2-dimensional aerial (and resist) image.

Thus, the model formulation describes most, if not all, of the known physics and chemistry of the overall process, and each of the model parameters desirably corresponds to a distinct physical or chemical effect. The model formulation thus sets an upper bound on how well the model can be used to simulate the overall manufacturing process. However, sometimes the model parameters may be inaccurate from measurement and reading errors, and there may be other imperfections in the system. With precise calibration of the model parameters, extremely accurate simulations can be done.

In a manufacturing process, variations in various process parameters have significant impact on the design of a suitable target that can faithfully reflect a device design. Such process parameters include, but are not limited to, side-wall angle (determined by the etching or development process), refractive index (of a device layer or a resist layer), thickness (of a device layer or a resist layer), frequency of incident radiation, etch depth, floor tilt, extinction coefficient for the radiation source, coating asymmetry (for a resist layer or a device layer), variation in erosion during a chemical-mechanical polishing process, and the like.

A metrology target design can be characterized by various parameters such as, for example, target coefficient (TC), stack sensitivity (SS), overlay impact (OV), or the like. Stack sensitivity can be understood as a measurement of how much the intensity of the signal changes as overlay changes because of diffraction between target (e.g., grating) layers. Target coefficient can be understood as a measurement of signal-to-noise ratio for a particular measurement time as a result of variations in photon collection by the measurement system. In an embodiment, the target coefficient can also be thought of as the ratio of stack sensitivity to photon noise; that is, the signal (i.e., the stack sensitivity) may be divided by a measurement of the photon noise to determine the target coefficient. Overlay impact measures the change in overlay error as a function of target design.

Described herein is a computer-implemented method of defining a metrology target design for use in, e.g., a metrology system simulation or in a target manufacturing process simulation (e.g., including exposing the metrology target using a lithographic process, developing the metrology target, etching the target, etc.). In an embodiment, one or more design parameters (e.g., geometric dimensions) for the target can be specified and further discrete values or a range of values can be specified for the one or more design parameters. Further, a user and/or the system may impose one or more constraints on one or more design parameters (e.g., a relationship between pitch and space width, a limit on pitch or space width, a relationship between feature (e.g., line) width (CD) and pitch (e.g., feature width is less than pitch), an asymmetry parameter, etc.) either in the same layer or between layers, based on, e.g., the lithographic process for which the target is desired. In an embodiment, the one or more constraints may be on the one or more design parameters for which discrete values or a range has been specified, or on one or more other design parameters.

Figure 17:
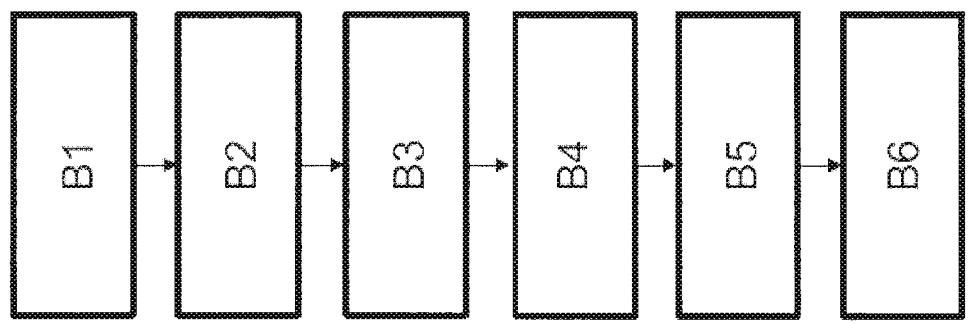
FIG. 17 depicts a flowchart illustrating a process of designing a metrology target according to an embodiment of the invention.

FIG. 17 schematically depicts a computer-implemented method of defining a metrology target design in accordance with an embodiment. The method includes, at block B1, providing a range or a plurality of values for each of a plurality of design parameters (e.g., geometric dimensions) of a metrology target.

In an embodiment, a user of a metrology target design system may specify one or more of the design parameters (e.g., geometric dimensions) for the metrology target. As an example, the user may specify that an extended operating range metrology target is desired and may further specify the number of sub-targets of the extended operating range metrology target. Further, in an embodiment, the user may specify (e.g., select) the discrete values or a range of values for each of one or more of the design parameters of the metrology target such as its one or more periodic structures. As an example for an extended operating range metrology target, the user may specify (e.g., select) the discrete values or a range of values for each of one or more of the design parameters of one or more sub-targets of the extended operating range metrology target, and of one or more periodic structures of the sub-targets. For example, the user may select a range or a set of values for feature (e.g., line) width, space width, size of the metrology target, pitch, etc. for the metrology target. In an embodiment, where the metrology target comprises multiple periodic structures (e.g., gratings), or segmented periodic structures (e.g., gratings), the user may select or provide a range or set of values for other design parameters, e.g., shared pitch.

In an embodiment, the design parameters may include any one or more geometric dimensions selected from: pitch of a periodic structure of the target, periodic structure feature (e.g., line) width of the target, periodic structure space width of the target, one or more segmentation parameters of the features of the periodic structure (segmentation pitch/feature width/space width in X and/or Y direction depending on segmentation type). Further, the parameters may be specified for a single layer or a plurality of layers (e.g., two layers or two layers plus an intermediate shielding layer). For a plurality of layers, they may share pitch. For certain metrology targets, e.g. focus or alignment targets, other parameters may be used. Other design parameters may be physical limitations such as one or more selected from: a wavelength of radiation used in the metrology system for the target, polarization of radiation used in the metrology system, numerical aperture of the metrology system, target type, and/or a process parameter. In an embodiment, non-uniform and non-symmetric patterns, for example modulated overlay targets and focus targets, may be provided. Thus, the design parameters may be varied and not necessarily uniform in a particular direction.

At block B2, there is provided one or more constraints for one or more design parameters of the metrology target. Optionally, the user may define one or more constraints. A constraint may be a linear algebraic expression. In an embodiment, the constraint may be non-linear. Some constraints may be related to other constraints. For example, feature width, pitch and space width are related such that if any two of the three are known, the third may be fully determined.

In an embodiment, the user may specify a constraint on the area, a dimension, or both, of the metrology target. For an extended operating range metrology target, the user may specify a constraint on the number of sub-targets.

In an embodiment, a constraint may be a metrology parameter constraint. For example, in some metrology systems, the physics of the system may place a constraint. For example, a wavelength of radiation used in the system may constrain the pitch of the target design, e.g., a lower limit. In an embodiment, there is a (upper/lower) limit on pitch as function of wavelength, the type of target and/or the aperture of the metrology system. Physical limitations that can be used as constraints include one or more selected from: a wavelength of radiation used in the metrology system, polarization of radiation used in the metrology system, numerical aperture of the metrology system, and/or target type. In an embodiment, the constraint may be a process parameter constraint (e.g., a constraint dependent on etch type, development type, resist type, etc.). In an embodiment, the constraint may be an asymmetry parameter as described herein.

Depending on the particular process being used, in an embodiment, one or more constraints may be related to a constraint between a design parameter (e.g., geometric dimension) of one layer and a design parameter (e.g., geometric dimension) of another layer.

At block B3, by a processor, the method solves for and/or selects by sampling within the range or the plurality of values for the design parameters, a plurality of metrology target designs having one or more design parameters meeting the one or more constraints. For example, in an embodiment involving solving, one or more potential metrology targets design may be solved for. That is, one or more potential metrology designs may be derived by solving for permitted values using, e.g., one or more equality constraints to solve for specific values. For example, in an embodiment involving sampling, a convex polytope may be defined by the various design parameters and constraints. The volume of the convex polytope may be sampled according to one or more rules to provide sample metrology target designs that meet all the constraints. One or more sampling rules may be applied to sample metrology target designs.

It is to be noted, however, that not all metrology target design thus discovered are equally representative of process variations. As such, in an embodiment, the metrology target designs discovered using a method described herein may be further simulated, at block B4, to determine, for example, the viability and/or suitability of one or more of the metrology target designs. The simulated metrology target designs may then be evaluated at block B5 to identify which one or more metrology target designs are best or more representative of process variation by, for example, ranking them based on a key performance index or a robustness criteria. At block B6, a particular metrology design may be selected and used, e.g., for measurement.

Figure 18:
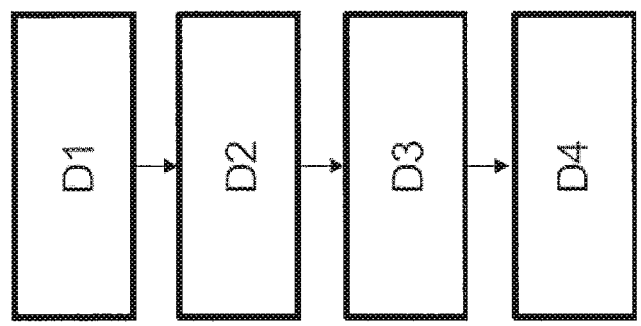
FIG. 18 depicts a flowchart illustrating a process in which the metrology target is used to monitor performance, and as a basis for controlling metrology, design and/or production processes according to an embodiment of the invention.

FIG. 18 shows a flowchart illustrating a process in which the metrology target is used to monitor performance, and as a basis for controlling metrology, design and/or production processes. In step D1, substrates are processed to produce product features and one or more metrology targets as described herein. At step D2, lithographic process parameter (e.g., overlay) values are measured and calculated using, e.g., the method of FIG. 6 and optionally, corrected using the asymmetry parameter. At step D3, the measured lithographic process parameter (e.g., overlay) value may be used (together with other information as may be available), to update a metrology recipe. The updated metrology recipe is used for re-measurement of the lithographic process parameter, and/or for measurement of the lithographic process parameter on a subsequently processed substrate. In this way, the calculated lithographic process parameter is improved in accuracy. The updating process can be automated if desired. In step D4, the lithographic process parameter value is used to update a recipe that controls the lithographic patterning step and/or other process step in the device manufacturing process for re-work and/or for processing of further substrates. Again this updating can be automated if desired.

In an embodiment, there is provided a method comprising: determining a type of a structural asymmetry of the target from measured values of the target; and performing a simulation of optical measurement of the target to determine a value of an asymmetry parameter associated with the asymmetry type.

In an embodiment, the asymmetry parameter comprises a positional offset, due the asymmetry, of a measurement using the target. In an embodiment, the asymmetry parameter comprises a scale factor relating a positional offset, due the asymmetry, of a measurement using the target to a process-dependent scale factor offset, due to the asymmetry, of measurement using the target. In an embodiment, determining the type of structural asymmetry of the target comprises evaluating values of overlay determined from measurement of the target or values of a process-dependent scale factor offset due to the asymmetry determined from measurement of the target, as a function of a parameter of the optical measurement. In an embodiment, the parameter of optical measurement comprises wavelength and/or polarization of a measurement beam of the optical measurement. In an embodiment, evaluating the determined values comprises determining a fit between (i) the determined values, or a construct representing the determined values, and (ii) one or more fingerprint sets of values of the overlay or process-dependent scale factor offset as a function of the parameter of the optical measurement, or one or more fingerprint constructs representing the fingerprint sets of values, each fingerprint set or fingerprint construct representing a different type of asymmetry. In an embodiment, the method further comprises analyzing a sensitivity of the asymmetry parameter to change in a target formation parameter associated with the target. In an embodiment, analyzing the sensitivity comprises determining a value of a parameter of the optical measurement for a minimum value of the sensitivity of the asymmetry parameter to change in the target formation parameter. In an embodiment, the parameter of the optical measurement comprises wavelength and/or polarization of a measurement beam of the optical measurement. In an embodiment, the analyzing comprises performing a simulation. In an embodiment, the target comprises overlying periodic structures. In an embodiment, performing the simulation comprises simulation of the optical measurement of overlying periodic structures set at a lateral shift of zero for a specified asymmetry. In an embodiment, the method further comprises determining, from the simulation, a value of a process-dependent scale factor offset, due to the asymmetry, of a measurement using the target and a value of a positional offset, due the asymmetry, of a measurement using the target. In an embodiment, the method further comprises correcting, based on the asymmetry parameter, an overlay or alignment value of the target determined from measurement of the target.

In an embodiment, there is provided a method comprising: performing a simulation of optical measurement of a target to determine a value of an asymmetry parameter associated with a type of a structural asymmetry of the target determined from measured values of the target; and analyzing a sensitivity of the asymmetry parameter to change in a target formation parameter associated with the target.

In an embodiment, the asymmetry parameter comprises a scale factor relating a positional offset, due the asymmetry, of a measurement using the target to a process-dependent scale factor offset, due to the asymmetry, of measurement using the target.

In an embodiment, the method further comprises determining a value of a parameter of the optical measurement for a minimum value of the sensitivity of the asymmetry parameter to change in the target formation parameter. In an embodiment, the parameter of the optical measurement comprises wavelength and/or polarization of a measurement beam of the optical measurement. In an embodiment, the analyzing comprises performing a simulation. In an embodiment, the target comprises overlying periodic structures. In an embodiment, performing the simulation comprises simulation of the optical measurement of overlying periodic structures set at a lateral shift of zero for a specified asymmetry. In an embodiment, the method further comprises determining, from the simulation, a value of a process-dependent scale factor offset, due to the asymmetry, used to determine a measurement using the target and a value of a positional offset, due the asymmetry, of a measurement using the target. In an embodiment, the method further comprises determining the type of structural asymmetry of the target by evaluating values of overlay determined from measurement of the target or values of a process-dependent scale factor offset due to the asymmetry determined from measurement of the target, as a function of a parameter of the optical measurement. In an embodiment, the method further comprises correcting, based on the asymmetry parameter, an overlay or alignment value of the target determined from measurement of the target.

In an embodiment, there is provided a method comprising: determining a structural asymmetry parameter of a target using a measured parameter of radiation diffracted by the target; and determining a property of a measurement beam of the target based on the structural asymmetry parameter that is least sensitive to change in a target formation parameter associated with the target.

In an embodiment, the method further comprises measuring the target using the property of the measurement beam and correcting, based on the structural asymmetry parameter, an overlay or alignment value of the target determined from the measurement of the target using the property of the measurement beam. In an embodiment, the structural asymmetry parameter comprises a positional offset, due the asymmetry, of a measurement using the target or a scale factor relating a positional offset, due the asymmetry, of a measurement using the target to a process-dependent scale factor offset, due to the asymmetry, of measurement using the target. In an embodiment, the property of the measurement beam comprises wavelength and/or polarization of the measurement beam.

In an embodiment, there is provided a method of manufacturing devices wherein a device pattern is applied to a series of substrates using a lithographic process, the method including evaluating at least one diffraction measurement target using a method as described herein and controlling the lithographic process for one or more of the substrates in accordance with the result of the method. In an embodiment, the at least one diffraction measurement target is formed as part of or beside the device pattern on at least one of the substrates and controlling the lithographic process for later substrates in accordance with the result of the method.

In an embodiment, there is provided a non-transitory computer program product comprising machine-readable instructions for causing a processor to cause performance of a method as described herein.

In an embodiment, there is provided a system comprising: an inspection apparatus configured to provide a beam on a diffraction measurement target on a substrate and to detect radiation diffracted by the target to determine a parameter of a lithographic process; and a non-transitory computer program product as described herein. In an embodiment, the system further comprises a lithographic apparatus comprising a support structure configured to hold a patterning device to modulate a radiation beam and a projection optical system arranged to project the modulated onto a radiation-sensitive substrate.

While embodiments of the metrology target described herein have mostly been described in the terms of overlay measurement, embodiments of the metrology target described herein may be used to measure one or more additional or alternative lithographic process parameters. For example, the metrology target may be used to measure exposure dose variation, measure exposure focus/defocus, etc.

While the target structures described above are metrology targets specifically designed and formed for the purposes of measurement, in other embodiments, properties may be measured on targets which are functional parts of devices formed on the substrate. Many devices have regular, periodic structures akin to a grating. The term grating or periodic structure of a target as used herein does not require that the grating or periodic structure has been provided specifically for the measurement being performed. Further, pitch P of the metrology target is close to the resolution limit of the optical system of the measurement tool, but may be much larger than the dimension of typical product features made by lithographic process in the target portions C. In practice the features and/or spaces of the overlay periodic structures may be made to include smaller structures similar in dimension to the product features.

In association with the physical structures of the targets as realized on substrates and patterning devices, an embodiment may include a computer program containing one or more sequences of machine-readable instructions and/or functional data describing the target design, describing a method of designing a target for a substrate, describing a method of producing a target on a substrate, describing a method of measuring a target on a substrate and/or describing a method of analyzing a measurement to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3, is already in production and/or in use, an embodiment of the invention can be implemented by the provision of an updated computer program product for causing a processor to perform one or more of the method described herein. The program may optionally be arranged to control the optical system, substrate support and the like to perform a method of measuring a parameter of the lithographic process on a suitable plurality of targets. The program can update the lithographic and/or metrology recipe for measurement of further substrates. The program may be arranged to control (directly or indirectly) the lithographic apparatus for the patterning and processing of further substrates.

While embodiments herein have focused on metrology targets to measure overlay, the description here may also apply, with modifications as appropriate, to, e.g., substrate and/or patterning device alignment in a lithographic apparatus using an alignment mark. Thus, for example, the structural asymmetry offset $K_{os}$ for an alignment mark may be directly measured with an alignment sensor and then a model of the alignment stack can be used to determine the scale factor between $K_{os}$ and the positional offset $X_{os}$ of the alignment due to the structural asymmetry. Similarly, the appropriate recipe for the alignment measurement may be determined.

Further, embodiments have been described herein in relation to diffraction-based metrology, which, for example, measures the relative position of overlapping periodic structures from the intensity from the diffracted orders. However, embodiments herein may be applied, with appropriate modification where needed, to image-based metrology, which, for example, measures the relative position from target 1 in layer 1 to target 2 in layer 2 using high-quality images of the targets. Usually these targets are periodic structures or "boxes" (Box-in-Box (BiB)).

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments reveals the general nature of embodiments of the invention such that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method comprising:
   determining an asymmetric deformation of a physical target using a measured parameter of radiation diffracted by the target; and
   determining, by a hardware computer system and based on the asymmetric deformation, a property of a measurement beam to optically measure the target or another target that is least sensitive to change in a target formation parameter associated with the target or the other target,
   where the property, or information derived from the property, is configured to setup or modify a measurement apparatus to measure the target or other target with a measurement beam according to the property.

2. The method of claim 1, further comprising measuring the target or other target using the property of the measurement beam and correcting, based on the asymmetric deformation, an overlay or alignment value of the target or other target determined from the measurement using the property of the measurement beam.

3. The method of claim 1, wherein the asymmetric deformation comprises a positional offset, due to the asymmetry, of a measurement using the target or the other target or comprises a scale factor relating a positional offset, due to the asymmetry, of a measurement using the target or the other target to a process-dependent scale factor offset, due to the asymmetry, of measurement using the target or the other target.

4. The method of claim 1, wherein the property of the measurement beam comprises wavelength and/or polarization of the measurement beam.

5. The method of claim 1, further comprising redesigning the target or other target or forming the target or other target, based on the asymmetric deformation.

6. A method of manufacturing devices wherein a device pattern is applied to a series of substrates using a lithographic process, the method including evaluating at least one diffraction measurement target using the method of claim 1 and controlling the lithographic process for one or more of the substrates in accordance with the result of the method.

7. A non-transitory computer program product comprising machine-readable instructions therein, the instructions, upon execution by a processor system, configured to cause the processor system to cause performance of the method of claim 1.

8. A system comprising:
an inspection apparatus configured to provide a beam on a diffraction measurement target on a substrate and to detect radiation diffracted by the target to determine a parameter of a lithographic process; and
the non-transitory computer program product of claim 7.

9. A method comprising:
determining an asymmetric deformation of a target from measured values of the target; and
performing a computer simulation of optical measurement of the target to determine a value of an asymmetry parameter associated with the determined asymmetric deformation.

10. The method of claim 9, wherein the asymmetry parameter comprises a positional offset, due to the asymmetry, of a measurement using the target.

11. The method of claim 9, wherein the asymmetry parameter comprises a scale factor relating a positional offset, due to the asymmetry, of a measurement using the target to a process-dependent scale factor offset, due to the asymmetry, of measurement using the target.

12. The method of claim 9, wherein determining the asymmetric deformation of the target comprises evaluating values of overlay determined from measurement of the target or values of a process-dependent scale factor offset, due to the asymmetry, determined from measurement of the target, as a function of a parameter of the optical measurement.

13. The method of claim 12, wherein the parameter of optical measurement comprises wavelength and/or polarization of a measurement beam of the optical measurement.

14. The method of claim 12, wherein the evaluating comprises determining a fit between (i) the determined values, or a construct representing the determined values, and (ii) one or more fingerprint sets of values of the overlay or process-dependent scale factor offset as a function of the parameter of the optical measurement, or one or more fingerprint constructs representing the fingerprint sets of values, each fingerprint set or fingerprint construct representing a different asymmetric deformation.

15. The method of claim 9, further comprising analyzing a sensitivity of the asymmetry parameter to change in a target formation parameter associated with the target.

16. The method of claim 15, wherein analyzing the sensitivity comprises determining a value of a parameter of the optical measurement for a minimum value of the sensitivity of the asymmetry parameter to change in the target formation parameter.

17. The method of claim 15, wherein the analyzing comprises performing a simulation.

18. The method of claim 9, wherein performing the simulation comprises simulation of the optical measurement of overlying periodic structures set at a lateral shift of zero for a specified asymmetry.

19. The method of claim 9, further comprising determining, from the simulation, a value of a process-dependent scale factor offset, due to the asymmetry, of a measurement using the target and a value of a positional offset, due to the asymmetry, of a measurement using the target.

20. The method of claim 9, further comprising correcting, based on the asymmetry parameter, an overlay or alignment value of the target determined from measurement of the target.

21. The method of claim 9, further comprising redesigning the target or forming the target, based on the asymmetry parameter or asymmetric deformation.

22. A method of manufacturing devices wherein a device pattern is applied to a series of substrates using a lithographic process, the method including evaluating at least one diffraction measurement target using the method of claim 9 and controlling the lithographic process for one or more of the substrates in accordance with the result of the method.

23. A non-transitory computer program product comprising machine-readable instructions therein, the instructions, upon execution by a processor system, configured to cause the processor system to cause performance of the method of claim 9.

24. A method comprising:
performing a computer simulation of optical measurement of a target to determine a value of an asymmetry parameter associated with an asymmetric deformation of the target determined from measured values of the target; and
analyzing a sensitivity of the asymmetry parameter to change in a target formation parameter associated with the target.

25. The method of claim 24, wherein the asymmetry parameter comprises a scale factor relating a positional offset, due to the asymmetry, of a measurement using the target to a process-dependent scale factor offset, due to the asymmetry, of measurement using the target.

26. The method of claim 24, further comprising determining a value of a parameter of the optical measurement for a minimum value of the sensitivity of the asymmetry parameter to change in the target formation parameter.

27. The method of claim 26, wherein the parameter of the optical measurement comprises wavelength and/or polarization of a measurement beam of the optical measurement.

28. The method of claim 24, wherein the analyzing comprises performing a simulation.

29. The method of claim 24, wherein performing the simulation comprises simulation of the optical measurement of overlying periodic structures set at a lateral shift of zero for a specified asymmetry.

30. The method of claim 24, further comprising determining, from the simulation, a value of a process-dependent scale factor offset, due to the asymmetry, used to determine a measurement using the target and a value of a positional offset, due to the asymmetry, of a measurement using the target.

31. The method of claim 24, further comprising determining the asymmetric deformation of the target by evaluating values of overlay determined from measurement of the target or values of a process-dependent scale factor offset, due to the asymmetry, determined from measurement of the target, as a function of a parameter of the optical measurement.

32. The method of claim 24, further comprising correcting, based on the asymmetry parameter, an overlay or alignment value of the target determined from measurement of the target.

33. The method of claim 24, further comprising redesigning the target or forming the target, based on the asymmetry parameter or asymmetric deformation.

34. A method of manufacturing devices wherein a device pattern is applied to a series of substrates using a lithographic process, the method including evaluating at least one diffraction measurement target using the method of claim 24 and controlling the lithographic process for one or more of the substrates in accordance with the result of the method.

35. A non-transitory computer program product comprising machine-readable instructions therein, the instructions, upon execution by a processor system, configured to cause the processor system to cause performance of the method of claim 24.

* * * * *